(12) United States Patent
Hadley et al.

(10) Patent No.: US 9,495,476 B2
(45) Date of Patent: Nov. 15, 2016

(54) PANOPTIC VISUALIZATION OF AN ILLUSTRATED PARTS CATALOG

(75) Inventors: Brent L. Hadley, Kent, WA (US); Stephen P. Miller, Bellevue, WA (US); Joseph F. Floyd, University Place, WA (US); Patrick J. Eames, Newcastle, WA (US); Michael K. Rodgers, Kirkland, WA (US)

(73) Assignee: The Boeing Company, Chicago, IL (US)

( * ) Notice: Subject to any disclaimer, the term of this patent is extended or adjusted under 35 U.S.C. 154(b) by 841 days.

(21) Appl. No.: 13/428,607

(22) Filed: Mar. 23, 2012

(65) Prior Publication Data

US 2013/0254640 A1    Sep. 26, 2013

(51) Int. Cl.
G06F 17/30    (2006.01)
G06F 17/50    (2006.01)

(52) U.S. Cl.
CPC ... *G06F 17/30943* (2013.01); *G06F 17/30716* (2013.01); *G06F 17/5095* (2013.01)

(58) Field of Classification Search
CPC .............. G06F 17/212; G06F 17/30011; G06F 17/30247; G06F 17/30943; G06F 17/5095
USPC ........................................ 715/202, 203, 209
See application file for complete search history.

(56) References Cited

U.S. PATENT DOCUMENTS

| | | |
|---|---|---|
| 5,341,466 A | 8/1994 | Perlin et al. |
| RE36,145 E | 3/1999 | DeAguiar et al. |
| 6,650,998 B1 | 11/2003 | Rutledge |
| 6,684,087 B1 | 1/2004 | Yu et al. |
| 6,704,024 B2 | 3/2004 | Robotham et al. |

(Continued)

FOREIGN PATENT DOCUMENTS

| | | |
|---|---|---|
| EP | 1 176 520 A2 | 1/2002 |
| EP | 1 503 301 A2 | 2/2005 |

(Continued)

OTHER PUBLICATIONS

European Search Report dated Mar. 6, 2013 for European Application No. 12198374.6, 7 pages.

(Continued)

*Primary Examiner* — Kavita Padmanabhan
*Assistant Examiner* — Brian Garmon
(74) *Attorney, Agent, or Firm* — Womble Carlyle Sandridge & Rice LLP

(57) ABSTRACT

An apparatus is provided for panoptic visualization of an illustrated parts catalog (IPC). The system includes a layout engine configured to generate a layout of pages of an IPC for a complex system, panoptically arranged in a manner that reflects logical relationships between the pages, which may in turn reflect relationships between the elements of the complex system. These logical relationships may be established by links between pages, which may be identified by information provided in associated metadata for the pages. This type of arrangement may enable a user to see the content in a single view, and in an arrangement that facilitates a better understanding of the relationships between the pages and elements they depict, which may be otherwise technically complex. This may in turn ease the difficulty and time required to search and/or navigate even the most massive amounts of information contained in some IPCs.

24 Claims, 17 Drawing Sheets

(56) References Cited

U.S. PATENT DOCUMENTS

| | | | |
|---|---|---|---|
| 6,766,331 | B2 | 7/2004 | Shema et al. |
| 7,200,271 | B2 | 4/2007 | Boose et al. |
| 7,246,328 | B2 | 7/2007 | Boose et al. |
| 7,365,747 | B2 | 4/2008 | Finlayson et al. |
| 7,783,644 | B1 | 8/2010 | Petrou et al. |
| 7,802,204 | B2 | 9/2010 | Merry et al. |
| 7,870,224 | B1 | 1/2011 | Maigatter |
| 7,872,650 | B2 | 1/2011 | Fay |
| 7,921,452 | B2 | 4/2011 | Ridlon et al. |
| 8,051,031 | B2 | 11/2011 | Sims, III et al. |
| 8,095,949 | B1 * | 1/2012 | Hendricks et al. ............. 725/29 |
| 2003/0055871 | A1 | 3/2003 | Roses |
| 2003/0100964 | A1 | 5/2003 | Kluge et al. |
| 2004/0003097 | A1 | 1/2004 | Willis et al. |
| 2004/0028294 | A1 | 2/2004 | Fukuda |
| 2004/0093564 | A1 | 5/2004 | Kumhyr et al. |
| 2004/0223648 | A1 | 11/2004 | Hoene et al. |
| 2004/0267701 | A1 | 12/2004 | Horvitz et al. |
| 2005/0240858 | A1 * | 10/2005 | Croft et al. .................... 715/500 |
| 2006/0161863 | A1 | 7/2006 | Gallo |
| 2006/0167711 | A1 * | 7/2006 | Chakraborty et al. ..................... G06F 17/243 705/26.1 |
| 2006/0178944 | A1 * | 8/2006 | Katter, Jr. et al. ................. G06F 17/30398 705/26.1 |
| 2007/0094615 | A1 | 4/2007 | Endo et al. |
| 2007/0226605 | A1 | 9/2007 | Thomas |
| 2008/0074423 | A1 | 3/2008 | Gan et al. |
| 2008/0111813 | A1 | 5/2008 | Gatzke et al. |
| 2008/0247636 | A1 | 10/2008 | Davis et al. |
| 2009/0086014 | A1 | 4/2009 | Lea et al. |
| 2009/0086199 | A1 | 4/2009 | Troy et al. |
| 2009/0112820 | A1 | 4/2009 | Kessel et al. |
| 2009/0138139 | A1 | 5/2009 | Tsai et al. |
| 2009/0317020 | A1 | 12/2009 | Gerhard et al. |
| 2010/0042361 | A1 | 2/2010 | Hadley et al. |
| 2010/0102980 | A1 | 4/2010 | Troy et al. |
| 2010/0223269 | A1 | 9/2010 | Shuf et al. |
| 2010/0229115 | A1 | 9/2010 | Augustine et al. |
| 2010/0306696 | A1 | 12/2010 | Groth et al. |
| 2011/0087463 | A1 | 4/2011 | Nakhle et al. |
| 2011/0087513 | A1 | 4/2011 | Floyd et al. |
| 2011/0149266 | A1 | 6/2011 | Motzer et al. |
| 2011/0235858 | A1 | 9/2011 | Hanson et al. |
| 2012/0188248 | A1 | 7/2012 | Eames et al. |
| 2012/0221625 | A1 | 8/2012 | Troy et al. |

FOREIGN PATENT DOCUMENTS

| | | |
|---|---|---|
| EP | 1 860 573 A1 | 11/2007 |
| EP | 2 482 538 A1 | 8/2012 |
| EP | 2 642 414 A2 | 9/2013 |
| WO | 2009005949 A1 | 1/2009 |

OTHER PUBLICATIONS

European Search Report dated Mar. 12, 2013 for European Application No. 12198679.8, 8 pages.

European Search Report dated Mar. 19, 2013 for European Application No. 12195735.1, 7 pages.

European Search Report dated Aug. 7, 2013 for European Application No. 13 160 361.5; 6 pages.

European Search Report dated Sep. 2, 2013 for European Application No. 13 160 848.1; 6 pages.

Rao et al., "Rich Interaction in the Digital Library," Apr. 1995, Communications of the ACM, Association for Computing Machinery, Inc., United States, vol. 38, No. 4, pp. 29-39.

EP Search Report dated May 15, 2012 for EP Appl. No. 12152591.9, 13 pgs.

"Futuristic software from Minority Report is real", 3 pages retrieved on Aug. 30, 2012 from http://www.foxnews.com/tech/2012/07/23/futuristic-software-from-minority-report-is-real/print.

Data differencing—Wikipedia, the free encyclopedia, 3 pages retrieved on Jul. 9, 2012 from http://en.wikipedia.org/w/index.php?title=Data_differencing&printable=yes.

"Theodolite Documentation/Help/FAQ" 6 pages retrieved on Dec. 14, 2012 http://hunter.pairsite.com/mobile/theodolite/help/index.html.

"Hard Rock Memorabilia", 2 pages retrieved on Apr. 18, 2012 http://memorabilia.hardrock.com.

"Deep Zoom" 4 pagess retrieved on Apr. 18, 2012 http://en.wikipedia.org/wiki/DeepZoom.

About Deep Zoom Composer, 4 pages retrieved on Nov. 23, 2011 http://msdn.microsoft.com/en-us/library/dd409068(d=printer).aspx.

Airframe & Powerplant Mechanics General Handbook, US Department of Transportation Federal Aviation Administration, Chapter 2, pp. 35-52; Mar. 31, 1999.

European Search Report dated Dec. 12, 2013 for European Application No. 13 184 084.5, 6 pages.

"Data differencing," 2012, Wikipedia, the Free Encyclopedia, [retrieved on Jul. 9, 2012] Retrieved using Internet <URL: http://en.wikipedia.org/w/index.php?title=Data_differencing&printable=yes, 3 pages.

International Search Report mailed on Jan. 18, 2013 for PCT/US2012/058937, 4 pages.

International Search Report mailed on Dec. 21, 2012 for PCT/US2012/054808, 4 pages.

Li et al., "Automated Generation of Interactive 3D Exploded View Diagrams," copyright Aug. 2008, ACM Transactions on Graphics, vol. 27, No. 3, 7 pages.

Quintana et al., "Will Model-based Definition replace engineering drawings throughout the product lifecycle? A global perspective from aerospace industry," copyright 2010, Computers in Industry, vol. 61, pp. 497-508.

Tatzgern et al., "Multi-Perspective Compact Explosion Diagrams," copyright Feb. 2011, Computers & Graphics, vol. 35, No. 1, pp. 135-147.

Hunter, "Theodolite, Documentation/Help/FAQ," Apr. 24, 2012, Hunter Research and Technology LLC [retrieved on Dec. 14, 2012] Retrieved using Internet <URL: http://hunter.pairsite.com/mobile/theodolite/help/, 6 pages.

Written Opinion mailed on Jan. 18, 2013 for PCT/US2012/058937, 9 pages.

Written Opinion mailed on Dec. 21, 2012 for PCT/US2012/054808, 6 pages.

European Search Report dated Feb. 10, 2014 for European Application No. 13 194 943.0, 6 pages.

European Search Report dated Apr. 4, 2014 for European Application No. 14 152 644.2, 8 pages.

European Search Report dated Apr. 4, 2014 for European Application No. 14 152 646.7, 9 pages.

Cohn, "Back to Flat—Producing 2D Output from 3D Models," Autodesk University 2009, Dec. 11, 2009, pp. 1-14.

Li et al., "Automated Generation of Interactive 3D Exploded View Diagrams," ACM Transactions on Graphics, vol. 27, No. 3, Aug. 1, 2008, 7 pages.

Petre et al., "3D Model-based Semantic Labeling of 2D Objects," 2011 International Conference on Digital Image Computing: Techniques and Applications (DICTA), IEEE, Dec. 6, 2011, pp. 152-157.

Tatzgern et al., "Multi-perspective Compact Explosion Diagrams," Computers & Graphics, vol. 35, No. 1, Feb. 1, 2011, pp. 135-147.

* cited by examiner

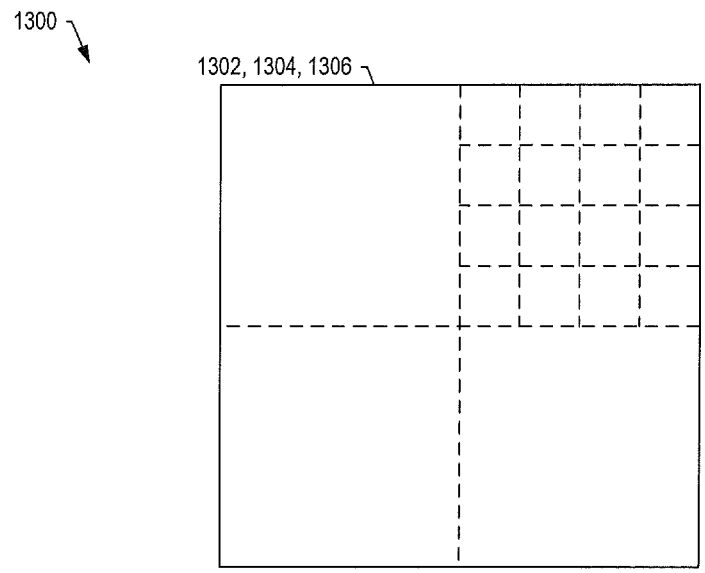
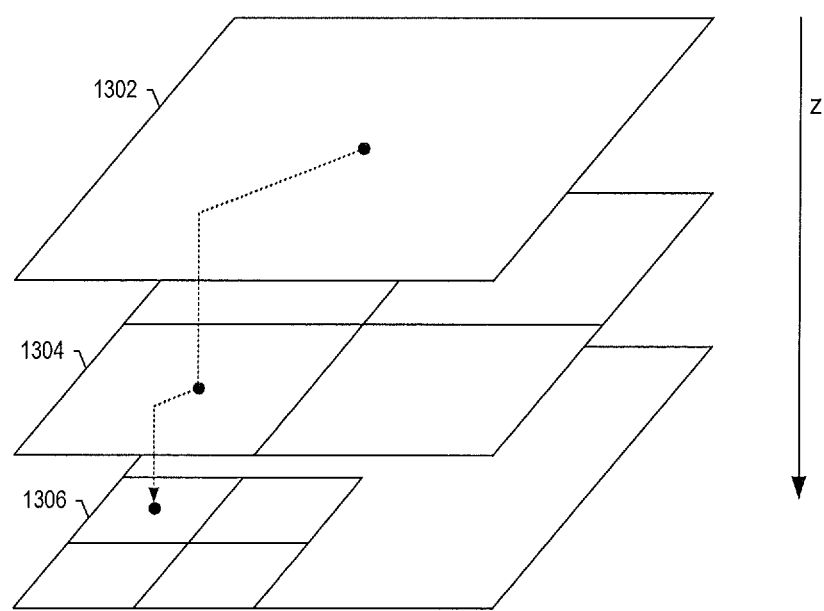
FIG. 13

PANOPTIC VISUALIZATION OF AN ILLUSTRATED PARTS CATALOG

CROSS-REFERENCE TO RELATED APPLICATION(S)

The present application is related to U.S. Provisional Patent Application No. 61/578,349, entitled: Panoptic Visualization Document Layout, U.S. Provisional Patent Application No. 61/578,357, entitled: Panoptic Visualization Document Navigation, and U.S. Provisional Patent Application No. 61/578,361, entitled: Panoptic Visualization Document Collection, all of which filed on Dec. 21, 2011. The present application is also related to U.S. patent application Ser. No. 13/072,217, entitled: Image Management and Presentation, filed on Mar. 25, 2011, which claims priority to U.S. Provisional Patent Application No. 61/436,585, entitled: Navigation to Aircraft Maintenance Information Using Tiled 2D Illustrations, filed on Jan. 26, 2011. The contents of all of the aforementioned are incorporated herein by reference in their entireties.

TECHNOLOGICAL FIELD

The present disclosure relates generally to panoptic visualization of documents and, in particular, to panoptic visualization of an illustrated parts catalog or its content in a manner that reflects logical relationships between the content and accurate parts information.

BACKGROUND

Complex and detailed illustrations such as illustrated parts catalogs (IPCs) and other technical drawings are commonly depicted in a hard-copy form including of multiple pages of drawings. Alternatively, separate drawings may be depicted in electronic graphic form. These drawings may contain large amounts of information regarding the parts they depict or graphics, and the connections and relationships among the parts. Some of the information contained in the drawings or graphics may be explicit, such as labels or other text. Other sources of drawing or graphic information may be implicit, such as the symbols or configurations.

When a user desires information concerning a specific part depicted in drawings or graphics, the user may be required to manually search through each page of a large set of drawings or an IPC, either on paper or on-line. For example, in industries that depend on complex technical drawings, manuals and IPCs for information about its systems, users may be required to manually search many pages of drawings or IPCs before they can perform maintenance or troubleshoot the system. This may be an undesirably lengthy process in instances in which the user must study the drawings or graphics to determine the way in which the drawings relate to each other and ensure he has all the drawings concerning the particular part of the system at issue. For instance, a part from one drawing or graphic may also be depicted on one or more of the other drawings or graphics. Thus, the drawings or graphics may have multiple references to the same part, both graphically and in the textual information associated with the part. Searching the hard copies of the parts catalogs and/or manuals to find all of the graphical and textual references to a specific part may be difficult, tedious and time-consuming because of the massive amounts of information they contain.

Therefore, may would be desirable to have a method and apparatus that takes into account at least some of the issues discussed above, as well as possibly other issues.

BRIEF SUMMARY

Example embodiments of the present invention are generally directed to a system for panoptic visualization of an illustrated parts catalog (IPC) for a complex system, and corresponding method and computer-readable storage medium. In accordance with example embodiments, drawings of an IPC may be panoptically arranged in a manner that reflects logical relationships between the drawings, which may in turn reflect structural relationships between elements of the complex system. The arrangement may enable a user to see the drawings in a single view, and in an arrangement that facilitates a better understanding of the relationships between the drawings and elements they depict, which may be otherwise technically complex. This may in turn ease the difficulty and time required to search and/or navigate even the most massive amounts of information contained in some IPCs.

According to one aspect of example embodiments, the system includes a layout engine configured to generate a layout of pages of an IPC for a complex system, with the IPC having a plurality of pages each of which depicts element(s) of the complex system, and each of which has associated metadata providing information about the respective page. The layout includes a panoptic arrangement of visual representations of the pages of the layout according to the associated metadata of the respective pages. In this regard, the metadata for each page also includes information identifying a link between the page and other page(s), with the link establishing a logical relationship between the respective pages according to a structural relationship between element(s) of the complex system depicted by the respective pages.

In one example, the complex system is composed of subsystem(s) each of which is composed of part(s), and in which each part includes feature(s). In this example, the elements of the complex system include any of the complex system, subsystem(s), part(s) or feature(s). Also in this example, for pages depicting elements including the complex system, subsystem(s), part(s) and/or feature(s), link(s) between the respective pages establishes logical relationship(s) between the respective pages according to structural relationship(s) between the respective elements depicted thereby.

In addition to the layout engine, the system of this aspect also includes a navigation engine coupled to the layout engine and configured to select navigation option(s) from a plurality of navigation options for navigating a visual presentation of the layout. In one example, the navigation engine is configured to select the navigation option(s) according to the associated metadata for the pages of the layout. The layout and navigation engines are also configured to communicate the layout and selected navigation options.

In one example, the system may further include a search engine coupled to the layout engine and configured to receive a request for a depiction of element(s) of the complex system, and identify a page including the requested depiction, with the identified page being of the IPC. In this example, the layout engine may be configured to retrieve pages of the IPC including the identified page and other page(s) identified according to the associated metadata for the identified page. In this regard, the respective metadata may further include information identifying link(s) between the identified page and respective other page(s). Also in this example, the layout engine may be configured to generate a layout of the retrieved pages.

Further in the preceding example, the search engine may be configured to receive the request from a user, and the metadata for each page of the IPC may also include information about content restriction(s) to be applied to the page. The layout engine may therefore be configured to retrieve pages of the IPC in accordance with user information and content restriction(s) to be applied to the respective pages.

In one example, the metadata for each page also includes information specifying a size, location and/or depth of the visual representation of the respective page in the layout, according to which the layout engine may be configured to generate the layout. In a further example, for each of one or more of the pages of the layout, the page may be in a state including visual representations at respective resolutions of the page, and the associated metadata may provide information specifying at least the size of the visual representation of the respective page in the layout. For each of one or more of the pages of the layout, then, the layout engine being configured to generate the layout may include being configured to retrieve the page for the visual representation at a resolution that matches the size specified by the information provided in the associated metadata.

In other aspects of example embodiments, a method and computer-readable storage medium are provided for panoptic visualization of an IPC. The features, functions and advantages discussed herein may be achieved independently in various example embodiments or may be combined in yet other example embodiments further details of which may be seen with reference to the following description and drawings.

BRIEF DESCRIPTION OF THE DRAWING(S)

Having thus described example embodiments of the invention in general terms, reference will now be made to the accompanying drawings, which are not necessarily drawn to scale, and wherein:

Figure 1:
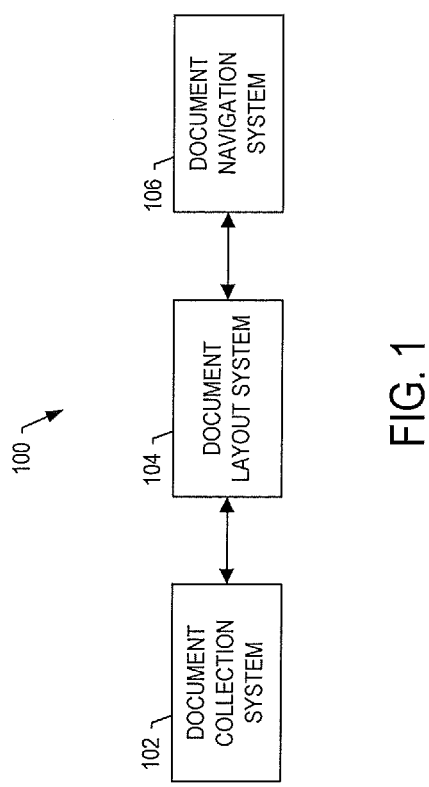
FIG. 1 is an illustration of a panoptic visualization system in accordance with an example embodiment.

FIGS. 5-16, which schematically illustrate examples of suitable layout models according to example embodiments; and FIGS. 17-22 depict example layouts of pages that may be displayed in a GUI that has a predetermined viewable area, and which may be navigated by a user, according to an example embodiment of the present invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these example embodiments are provided so that this disclosure will be thorough and complete, and will fully convey the scope of the invention to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example embodiments of the present invention relate generally to panoptic visualization of documents and, in particular, to panoptic visualization of an illustrated parts catalog (IPC) or its content (document components) in a manner that reflects logical relationships between the content. Example embodiments will be primarily described in conjunction with aerospace applications. It should be understood, however, that example embodiments may be utilized in conjunction with a variety of other applications, both in the aerospace industry and outside of the aerospace industry. Access to accurate parts information across industries is important because it can impact multiple aspects of equipment operations, including maintenance, materials-inventory management, purchasing and procurement, engineering support, logistics planning, shipping and receiving, and warehouse facilities management.

Referring now to FIG. 1, a panoptic visualization system 100 is illustrated according to example embodiments of the present invention. The system may include any of a number of different subsystems (each an individual system) for performing one or more functions or operations with respect to one or more electronic documents, such as one or more IPCs. As shown, for example, the system may include a document collection system 102, document layout system 104 and/or document navigation system 106. Although being shown as part of the panoptic visualization system, one or more of the document collection system, layout system and/or navigation system may instead be separate from but in communication with the panoptic visualization system. It should also be understood that one or more of the subsystems may function or operate as a separate system without regard to others of the subsystems. And further, it should be understood that the panoptic visualization system may include one or more additional or alternative subsystems than those shown in FIG. 1.

As described herein, an electronic document (or simply document) may be any electronic media content capable of being visualized in an electronic and/or printed (or printable) form. The media content of a document may include one or more of textual, graphical or other visual content such as still images, video or the like. The document may be of a number of different types of documents in which the type of document may be defined by one or more characteristics of the document such as its format, media content or the like. Examples of suitable types of documents include computer-aided design documents (e.g., CAD, CATDrawing, CATPart, CATProduct, CATProcess, cgr, DWG, DXF, DWF, etc.), text-based documents (e.g., ANS, ASC, DOC, DOCX, HTML, PDF, RTF, TXT, WPD, etc.), presentation documents (e.g., PDP, PPT, etc.), graphics documents (e.g., BMP, GIF, JPEG, JP2, PNG, PSD, PSP, RAW, TIFF, etc.), video documents (e.g., AVI, MPEG, QuickTime, WMV, etc.) or the like. Other examples of suitable types of documents include single or collections of legal documents (e.g., court decisions, briefs, patents, etc.), books, articles, web pages, screenshots, service bulletins, engineering diagrams, warranties, technical drawings, wiring diagrams or the like. And still further examples of suitable types of documents include data sets such as engineering design data, wiring data, troubleshooting data, business data or the like.

A document may be composed of content such as in the form of one or more constituent document components that may be groupings of its media content such as between basic breaking points. The document components may depend on the type of document and may include, for example, electronic pages, slides, diagrams, drawings, still images, videos or the like. The document component may at times be generally referred to as a "page," although the document component need not necessarily be an electronic page as it may include other types of components. In instances in which a document includes only one component, the document and its component may be one and the same.

As described herein, reference may be made to a document composed of constituent pages. It should be understood, however, that example embodiments may be equally applicable to a group (collection) of documents composed of constituent documents, which may or may not be further composed of constituent pages. Thus, functions performed with respect to a document may be equally performed with respect to a group of documents, and functions performed with respect to a page may be equally performed with respect to a constituent document.

Each page may be formed of data from which a visual representation of it (or rather its media content) may be generated in an electronic and/or printed (or printable) form. The visual representation of a page may at times be generally referred to as simply the page or as an "image," although the page need not necessarily include a still image as it may include other types of media content.

A page may include media content that has one or more subjects and includes one or more objects reflecting or otherwise forming the subject(s). At times, a page may therefore be said to depict its subject(s) and/or object(s) of its subject(s). As an example, a page may have an aircraft as its subject and include an exterior or interior view or sections of the exterior/interior view of the aircraft as object(s), or the page may have the exterior/interior view as its subject and include the sections of the exterior view as objects. As another example, a page may have an aircraft instrument panel as its subject and include gauges of the instrument panel as subjects.

In one example, a document may be from one or more illustrated parts catalogs (IPCs) for a complex system such as an aircraft. A complex system may be generally composed of one or more components, subsystems or the like (each generally referred to as a "subsystem"), with each subsystem being composed of one or more parts, and each part including one or more features. In this regard, the parts of the complex system may be assembled into a number of subsystems, which in turn may be assembled into the complex system. In the context of an aircraft, one or more parts or subsystems may be designed as a modular component of the aircraft often referred to as a line-replaceable unit (LRU), of which a single aircraft may include a number of LRUs and other parts or subsystems. Any of the complex system itself or any of its subsystems, parts (of subsystems), features (of parts) or the like may at times be generally referred to as an "element" of the complex system.

The IPC for a complex system may be composed of pages including media content. In one example, the media content may include drawings and/or textual lists of the elements of the complex system, and may additionally include other information regarding the elements. A page may include one or more drawings, and a drawing may depict one or more elements. In one example, a page may include a drawing (media content) of a complex system (subject) including multiple subsystems (objects). In another example, a page may include a drawing of a subsystem (subject) including multiple parts (objects). And in yet another example, a page may include a drawing of a part (subject) including one or more features (objects).

The drawings may depict elements in various views with various levels of detail. The drawings may include detail drawings, assembly drawings and/or installation drawings. A detail drawing may depict a part. An assembly drawing may depict the complex system or one or more of its subsystems. The assembly drawing may reflect any of a number of different relationships between or among the complex system, its subsystems or parts of its subsystems. For example, an assembly drawing may reflect a relationship between subsystems of a complex system, or a relationship between parts of a subsystem. In one example, one or more assembly drawings are accompanied by one or more detailed drawings of one or more parts it depicts. An illustration drawing may depict an element in its final position on the complex system.

The drawings may depict elements in any of a number of different manners, such as by pictorial drawings, diagrams and/or orthographic projections. A pictorial drawing may depict an element as it appears to the eye (similar to a photograph). A diagram may depict the complex system or one or more of its subsystems, and may indicate their subsystems or parts and express methods or principles of operation (e.g., illustration diagram).

Orthographic projection drawings may depict an element in a number of views, which may depict the element from one or more angles and/or levels of detail. For example, an element may be depicted in one or more of front, top, bottom, rear, right-side and/or left-side views. Also, for example, a view of an element may be a complete view, a detail view or sectional view. A complete view may be considered a principal view of an element, and may depict the element at any angle. A detail view may only depict a portion of an element but do so in greater detail and to a larger scale than the principle view, and a sectional view may depict a portion of an element with the rest of the element being cut away at a cutting plane. In one example, the portion of an element depicted in a detail view may be encircled on a related complete view; and similarly, in one example, the portion of the element depicted in a sectional view may be indicated by the cutting plane line on the related complete view.

Although the IPC for a complex system may be described as primarily including drawings, it should be reiterated that the IPC may also include one or more textual lists such as parts lists for the complex system. In this regard, in addition to or in lieu of drawing(s), each of one or more pages of the IPC may include a textual list (media content), and a textual list may textually depict one or more elements. A list may include any of a number of different types of information regarding element(s) of the complex system. For each of one or more elements, for example, a list may include a name, number (e.g., part number) or other identifier of the element, a required quantity of the element, the source of the element (e.g., manufacturer, distributor, etc.), the position of the element, related element identifiers or the like. The list may also include one or more references that identify the element in drawing(s) of the IPC, and/or one or more references that identify drawing(s) depicting the element (partially or completely). A page of an IPC may therefore depict one or more elements graphically by drawing(s) and/or textually by list(s).

Generally, documents and/or their pages according to example embodiments may have one or more logical relationships between one another. In the context of an IPC, for example, pages sharing a common IPC may be logically related, or pages adjacent one another in order sequence in a common IPC may be logically related. In other examples, the pages may be logically related according to one or more structural relationships between the elements of the complex system depicted in their drawings or textual lists. In this regard, pages depicting the same element (partially or completely) may be logically related according to the structural relationship of depicting the same element. A page depicting the complex system may be logically related to pages depicting the complex system's subsystems, parts or features, according to the structural relationship between the respective elements. A page depicting a subsystem may be logically related to pages depicting the subsystem's parts or features, according to the structural relationship between the respective elements. And a page depicting a part may be logically related to pages depicting the part's features, according to the structural relationship between the respective part and features.

In one example, logical relationship(s) between pages may be reflected in the drawings and/or lists themselves. One or more drawings and/or lists depicting one or more elements may include reference(s) such as number(s), letter(s), symbol(s) or the like to identify the respective element(s), or identify other drawing(s) depicting the respective element(s) (partially or completely). In the case of a reference identifying an element, the reference may be referred to as a callout. In one example, multiple drawings depicting the same element (partially or completely) may include the same callout to identify that element. In another example, a drawing of a complete view of an element may include a reference to another drawing of a detail view of the respective element.

As explained in greater detail below, the document collection system 102 of the panoptic visualization system 100 may be generally configured to receive documents and collect pages according to these logical relationships, with the pages being collected as a document collection for panoptic visualization (a panoptic visualization document collection). The document layout system 104 may be generally configured to generate a layout of panoptically-arranged, logically-related pages of a panoptic visualization document collection, such as the collection from the document collection system. The document navigation system 106 may be generally configured to select and provide navigation option(s) for navigating a visual presentation of a layout of panoptically-arranged, logically-related pages of a panoptic visualization document collection, such as the layout generated by the document layout system. The visual presentation of a layout may at times be generally referred to as simply the layout.

Example embodiments of the present invention may therefore collect pages of document(s) according to logical relationships between the pages, which in one example in the context of a complex system such as an aircraft, may reflect structural relationships between its elements. The pages may be panoptically arranged in a manner that reflects the logical relationships, and in various examples, structural relationships. The arrangement may enable a user to see the pages in a single view, and in a manner that facilitates a better understanding of relationships that may be otherwise difficult to comprehend. In the context of a complex system for example, the arrangement may not only lessen the time required to review documents containing large amounts of information, but may also lessen the time required and ease the difficulty studying the information to understand the ways in which the complex system and its elements relate to each other.

Figure 2:
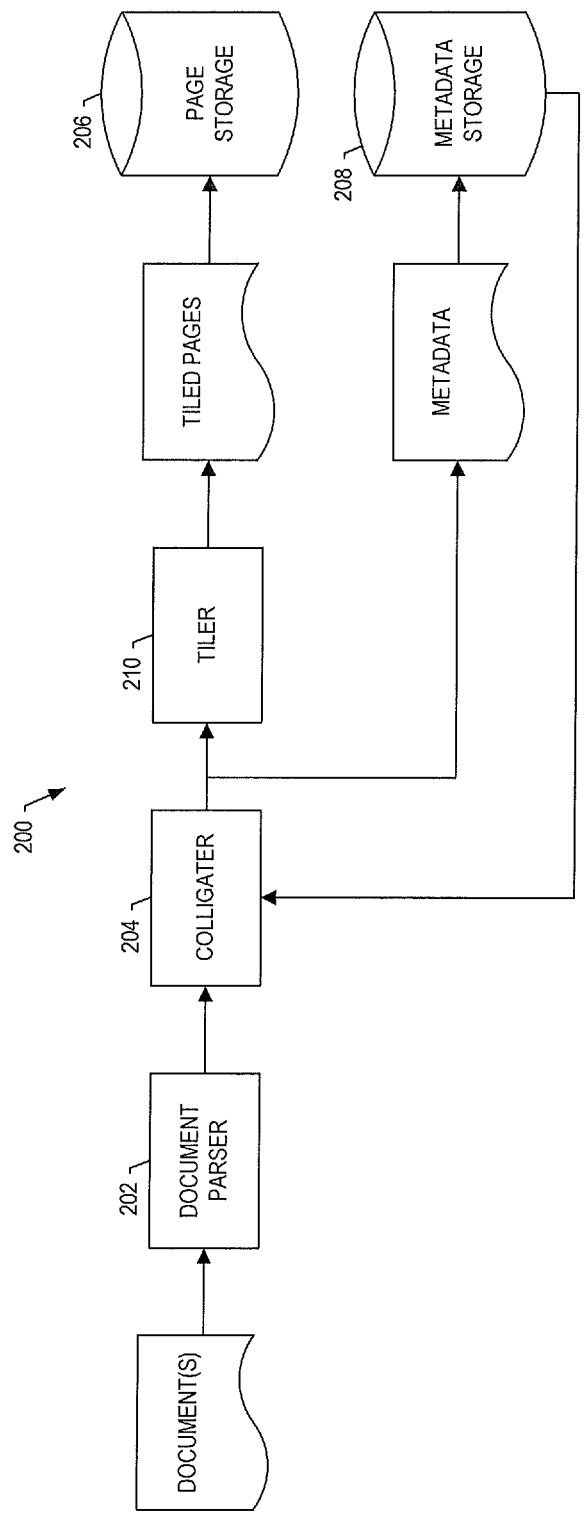
FIG. 2 is an illustration of a panoptic visualization document collection system in accordance with one example embodiment.
Figure 3:
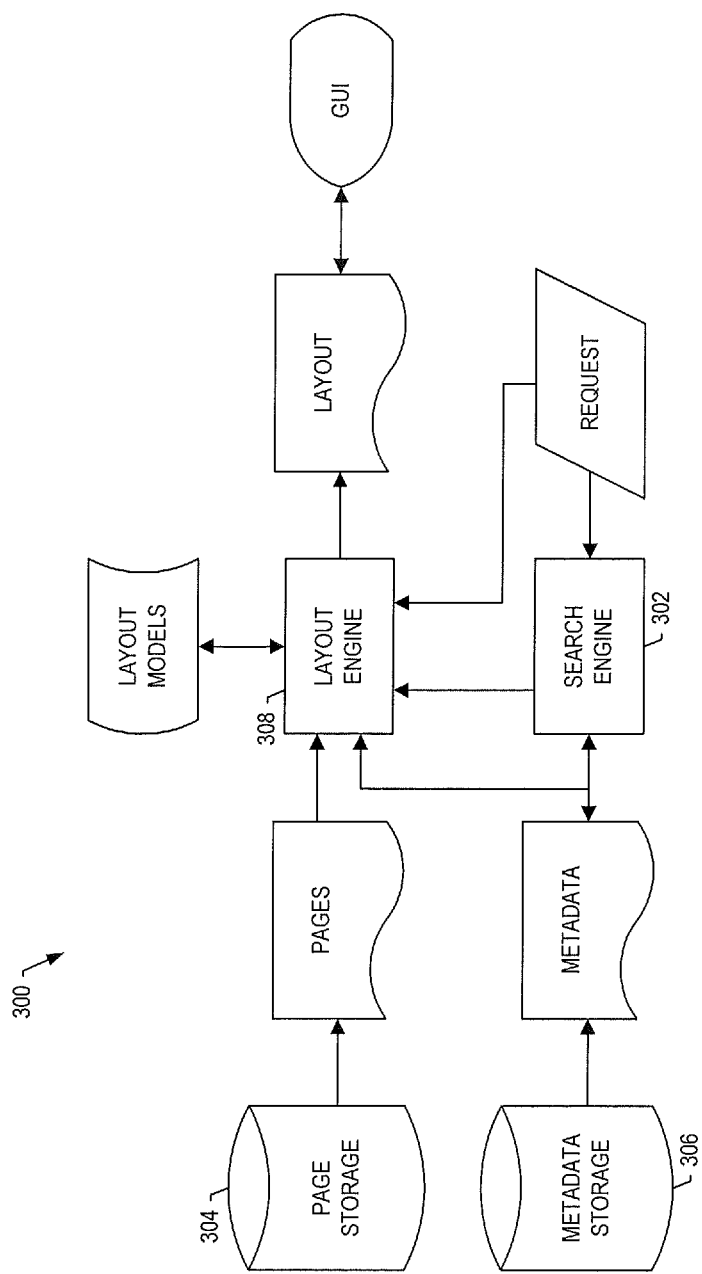
FIG. 3 is an illustration of a panoptic visualization document layout system in accordance with one example embodiment.
Figure 4:
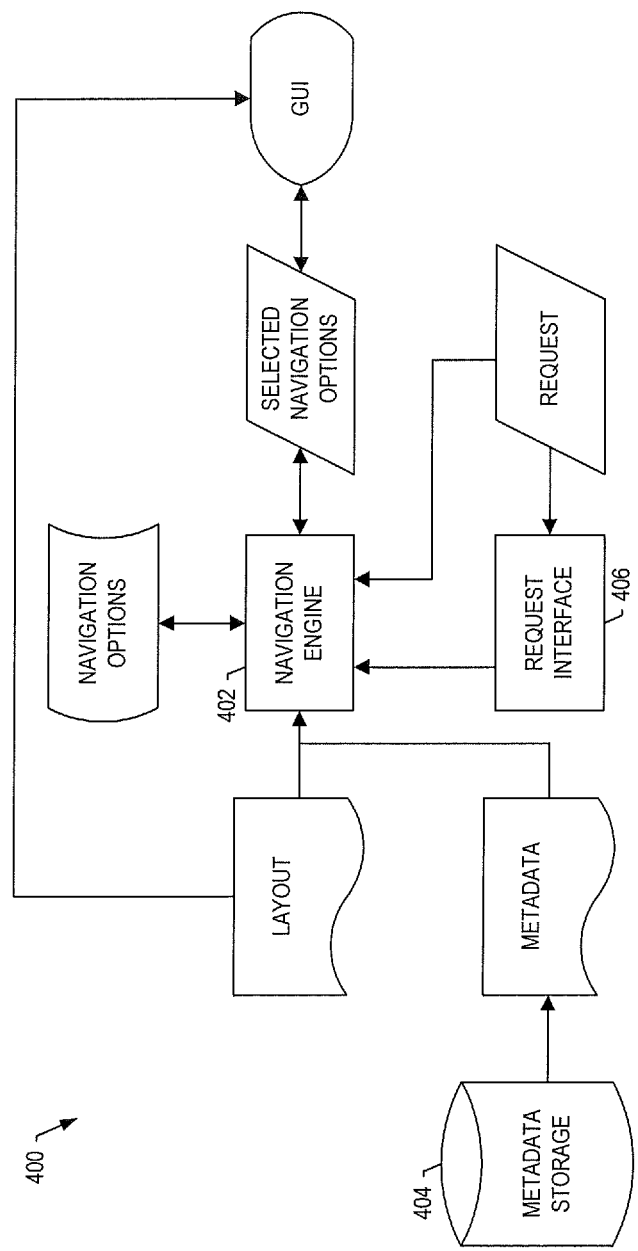
FIG. 4 is an illustration of a panoptic visualization document navigation system in accordance with one example embodiment.

Reference will now be made to FIGS. 2, 3 and 4, which illustrate more particular examples of a suitable document collection system, document layout system and document navigation system, respectively, according to example embodiments of the present invention.

FIG. 2 illustrates a document collection system 200 according to one example embodiment. As shown, the document collection system may include a document parser 202 configured to receive and disassemble one or more electronic documents into a plurality of constituent pages (document components) each of which includes respective media content. The documents in one example may be disassembled according to the type of the documents (e.g., computer-aided design documents, presentation documents, graphics documents, video documents, legal documents, books, articles, web pages, engineering diagrams, technical drawings, wiring diagrams, etc.). The document parser may therefore also be configured to identify the type of the documents, such as based on the format of the documents, business rules or by user input.

The document collection system 200 may also include a colligater 204 coupled to the document parser 202 and configured to colligate the pages. In this regard, the colligation of the pages may include, for each of one or more pages of the plurality, the colligater being configured to identify one or more links between the page and one or more other pages of the plurality. The link(s) of one example may be identified according to the documents, type of documents, and/or media content of the page and other page(s). And in one example, the link(s) may be defined according to one or more business rules, logic or the like. These link(s) may establish one or more logical relationships between the page and other page(s).

In one example, a link may be identified between pages sharing a common document (constituents of the same document). In one example, a link may be identified between pages adjacent one another in a predetermined sequence, such as a time sequence, spatial sequence or an order sequence in a common document or collection of documents. In some instances, a link may be identified according to the subject(s) or object(s) of the pages. For example, a link may be identified between pages sharing a common subject or common object. In one example, a link may be identified between pages in which an object of one is a subject of the other (object-subject), or in which a subject of one is an object of the other (subject-object).

In one example, a link may be identified between pages related by a parent-child relationship. In one example, a link may be identified between pages in instances in which one of the pages includes a reference or link to the other page in its media content. In this regard, a court decision may include a citation to another court decision (e.g., in the body of the court decision, or in a footnote, endnote or the like), or a page may include a hyperlink to another page. And in yet another example, a link may be identified between pages by user input specifying a link between pages.

In a more particular example in the context of an IPC, a link may be identified between pages sharing a common IPC, or pages adjacent one another in order sequence in a common IPC. In other examples, link(s) may be identified between pages according to one or more structural relationships between the elements of the complex system depicted by the pages. A link may be identified between pages depicting the same element (partially or completely). A link may be identified between a page depicting the complex system, and pages depicting the complex system's subsystems, parts or features. Similarly, link may be identified between a page depicting a subsystem, and pages depicting the subsystem's parts or features. And in yet another example, a link may be identified between a page depicting a part, and pages depicting the part's features. In various instances, these examples may reflect an object-subject or subject-object relationship, or may reflect a parent-child or other hierarchical relationship.

In addition to identifying link(s) between pages, the colligator 204 may also be configured to extract, generate or otherwise provide, for each of one or more pages, metadata associated with the page. For a page, its associated metadata may provide any of a number of different pieces of information about the page. For example, the metadata may provide information identifying the link(s) between the page and other page(s) in metadata associated with the page. This information may include the names or other identifiers of the other page(s) linked to the page, and may also include an indication of the logical relationship(s) established by the link(s) therebetween (e.g., share common document, subject and/or object, adjacency, object-subject subject-object, parent-child, reference/link, user specified, etc.).

In addition to the link(s), the associated metadata for a page may include one or more other pieces of information about the page. For example, the metadata may provide information regarding the document for which the page is a constituent, such as the name or other identifier of the document, and/or an author, size, and/or time of creation or last revision of the document. Also for example, the metadata may provide information about the media content of the page. This information may include, for example, identification of the page's subject(s) and/or object(s), the portion of the page including one or more of the object(s), and/or a level of detail of one or more of the object(s) in the page. In the context of an IPC for a complex system, for example, the information may include identification of and possibly other information related to elements of the complex system (e.g., complex system, subsystems, parts, features). In various instances, a link between pages sharing a common subject, object or having an object-subject or subject-object relationship may be inferred from the metadata identifying the respective documents' subject(s) and/or object(s). In these instances, specification of a page's subject(s) and/or object(s) may suffice as information identifying the appropriate link(s) between pages.

The metadata may also provide information about one or more content restrictions applied or to be applied to the page, such as access restrictions, editing or modification restrictions, and/or encryption of the page. In one example in the context of an IPC for a complex system such as aircraft, content restrictions may be applied on one or more bases such as organization (airline customer), type of or individual complex system (e.g., type of or individual aircraft), element of the complex system or the like. In this example, the information about the content restrictions may relate back to or otherwise incorporate other metadata, such as in the context of identification of users, types or individual complex systems, or information regarding its elements, which may be reflected elsewhere in the metadata.

In one example, the colligation of pages may further include the colligater 204 being configured to identify one or more layout models for at least some of the pages. In this example, the associated metadata extracted, generated or otherwise provided by the colligater for a page may further include information specifying an arrangement of the respective page in each of one or more of the layout models. For a respective layout model, this may include, for example, specifying a size, location and/or depth (z-order) of the page (or more particularly its visual representation). The layout model(s) may be identified and size, location and/or depth may be specified in any of a number of different manners, such as according to one or more business rules, logic or the like.

Examples of suitable layout models (sometimes referred to as styles of presentation) include brickwall, partial brickwall, hierarchy, shape, center out, top-down/triangulated, center-out triangulated, size dominance, overlap through detail, master-detail through depth, load shape, facet, mixed-media/static-and-dynamic or the like. Other examples may include combinations of one or more of the foregoing layout models. Each of a number of example layout models will be further described below.

In one example, the size of a page in a layout model may be specified as an absolute size or a relative size, either of which may be given in a number of different manners. In various instances, the size of the page may relate to a size in pixels and therefore give a pixel count or pixel resolution of the page. In one example, the absolute size of a page may be given in height and width dimensions (e.g., N×M pixels). In another example, the size of the page may be specified as a relative size based on the size of one or more other pages to which the page is logically related. For example, the relative size may be given in a number of different manners, such as in a percentage, fraction or multiple of other page(s); or the relative size may be given simply by an indication of smaller than, larger than or equal in size to other page(s). In pages related by a parent-child relationship, for example, the size of the child page may be specified as being half the size of its parent. In any event in which the size is relative, the size of the respective other page(s) may be given in their associated metadata, and may be given as an absolute size or relative size based on the size of even further other pages.

Similar to size, in one example, the location (sometimes referred to as position) of a page in a layout model may be specified as an absolute location or relative location, but in either event, may be given in a number of different manners. Likewise, the depth of a page in a layout model may be specified as an absolute depth or relative depth, either of which may be given in a number of different manners. For example, the absolute location of the page may be given in x, y coordinates of a coordinate system that spans the layout model, and/or the absolute depth may be given in a z coordinate of the coordinate system. In another example, the relative location of the page may be given in x, y coordinates relative to a point or other page(s) in the layout model. In yet another example, the relative location may be given simply by an indication of above, below, left or right of a point or other page(s) in the layout model. Similarly, in one example, the relative depth may be given simply by an indication of a page being in-front or behind other page(s) in the layout model. In any event in which the location and/or depth is relative, the location and/or depth of the respective other page(s) may be given in their associated metadata, and may be given as an absolute or relative location and/or depth.

The colligater 204 may be configured to communicate the pages and metadata as a panoptic visualization document collection, and communicate the collection to any of a number of different destinations. In one example, the colligater may be configured to communicate the pages and metadata to respective storage 206, 208 for later retrieval. The storage may be resident with the document collection system 200, or may be separate from and in communication with the document collection system. The pages and metadata may be formatted and stored in any of a number of different manners, and hence, their storage may be of any of a number of different types. Examples of suitable types of storage include file storage, database storage, cloud storage or the like.

In various examples, before pages are stored in respective storage 206, the pages may be compressed or otherwise processed for easier storage and retrieval. As shown, for example, the system may include a tiler 210 coupled to the colligater, and to which the colligater is configured to communicate the pages. The tiler may be configured to generate, for each of one or more pages, visual representations of the page at respective resolutions for zoom levels of the page. As described herein, the page (or rather its visual representation) at each zoom level may be generally referred to as a "sub-image," and may at times be considered a separate version or copy of the page. As suggested above, however, a sub-image of a page need not necessarily include a still image as the page may include other types of media content.

In addition to or in lieu of generating sub-images of a page, the tiler 210 may be configured to divide the sub-images across the zoom levels into progressively larger numbers of tiles each of which covers a spatial area of a sub-image at a respective zoom level. This may facilitate retrieval, panning and/or zooming of the page, as explained further below. The tiler may then be further configured to communicate the tiles of the sub-images of the pages, such as to the page storage. Before communicating the tiles, however, the tiler may be further configured to compress the tiles, if so desired.

In one more particular example, the tiler 210 may be configured to generate multiple resolutions of a page at respective zoom levels arranged hierarchically from a top zoom level through one or more intermediate zoom levels to a base zoom level. Each zoom level includes a sub-image of the entire page but at a different resolution; and the sub-images of the page across zoom levels may have the same native aspect ratio (ratio of the width of the image to its height). In one example, the top zoom level (level 0) may include a sub-image of the entire page at its lowest resolution, the one or more intermediate zoom levels may include a sub-image of the entire page at progressively higher resolutions (level 1 immediately below level 0, level 2 immediately below level 1, etc.), and the base zoom level (level L) may include a sub-image of the entire page at its highest (or full) resolution.

Each sub-image of a page may be generated in any of a number of different manners. In one example, one of the sub-images may be received by the tiler 210, such as the full-resolution sub-image. The tiler may then be configured to generate the other sub-images at lower resolutions, such as by downsampling the full-resolution sub-image.

As indicated, the tiler 210 may be configured to divide sub-images across zoom levels into progressively larger numbers of tiles each of which covers a spatial area of a sub-image at a respective zoom level. The tiles may have a fixed size (resolution) within and across the zoom levels, and accordingly, a sub-image composed of a larger number of tiles may generally have a higher resolution than a sub-image composed of a smaller number of tiles. Each zoom level may therefore be considered a higher zoom level relative to any zoom level above it (the sub-image at the zoom level being at a higher resolution than the sub-image at any zoom level above it). Similarly, each zoom level may be considered a lower zoom level relative to any zoom level below it (the sub-image at the zoom level being at a lower resolution than the sub-image at any zoom level below it).

In one example, the sub-image at each zoom level may be half the resolution of the zoom level immediately below it, and twice the resolution of the zoom level immediately above it (the resolutions increase or decrease by a factor of two). In this example, the number of tiles in a zoom level l may be given by $t_l = t_0 \times 4^l$, in which l=0, 1, 2, . . . L, and $t_0$ represents the number of tiles in the top zoom level (level 0). In a more particular example including four zoom levels 0, 1, 2 and 3 (L=3), and in which the top zoom-level sub-image is composed of 1 tile ($t_0$=1), the first intermediate zoom-level (level 1) sub-image may be composed of 4 tiles, the second intermediate zoom-level (level 2) sub-image may be composed of 16 tiles, and the base zoom-level (level 3) sub-image may be composed of 64 tiles.

In one example, a page covered by a number of tiles in one zoom level may be covered by an increased or decreased number of tiles in higher or lower zoom levels, respectively, thereby leading to an increase or decrease in resolution of the page. Similarly, an area of a page covered by one tile in one zoom level may be covered by multiple (e.g., four) tiles in an adjacent higher zoom level, thereby leading to an increase in resolution of the respective area of the page. And an area of a page covered by multiple tiles in one zoom level may be covered by one tile in an adjacent lower zoom level, thereby leading to a decrease in resolution of the respective area of the page.

In one example, a page (or area thereof) at a particular resolution may be displayed by the tile(s) covering the page at the zoom level commensurate with the particular resolution. A zoom-in of the page may be effectuated by replacing the displayed tile(s) with the increased number of tiles covering the page at a higher zoom level. And a zoom-out of the page may be effectuated by replacing the displayed tiles with the decreased number of tile(s) covering the page at a lower zoom level. And because the page may be divided into tiles, in instances in which a portion but not all of a page is viewable in a graphical user interface (GUI) in which the page is displayed, only those tiles covering the viewable portion of the page may be retrieved and displayed.

Reference is now made to FIG. 3, which illustrates a document layout system 300 according to one example embodiment. As indicated above, the document layout system 300 may be one example of the document layout system 104 of the panoptic visualization system 100 of FIG. 1. The document layout system may be generally configured to generate a layout of panoptically-arranged, logically-related pages of a panoptic visualization document collection. This collection may be, for example, the collection from the document collection system 102, or more particularly in one example, the document collection system 200 of FIG. 2.

As shown in FIG. 3, the document layout system 300 may include a search engine 302, request interface or the like configured to receive a request for media content and identify one or more pages including the requested media content. For example, the search engine may be configured to receive a request for a depiction of one or more elements of a complex system, such as a drawing that graphically depicts element(s) and/or a textual list that textually depicts element(s). The identified page may be of a panoptic visualization document collection having a plurality of pages each of which includes respective media content and has associated metadata providing information about the respective page. The pages and metadata may be stored in respective storage 304, 306, which in one example may correspond to respective storage 206, 208 shown in FIG. 2.

The search engine 302 may be configured to identify page(s) in a number of different manners, such as based on the associated metadata of the pages of the collection. For example, the request may include a keyword matching or otherwise having relevance to a subject or object of page(s) of the collection. In response to the request, then, the search engine may be configured to search the metadata storage 306 for the associated metadata of one or more page(s) including media content matching or relevant to the request.

The document layout system 300 may also include a layout engine 308, layout generator or the like coupled to the search engine 302 and configured to select a layout model (style of presentation) from a plurality of layout models for panoptically-arranged pages of the plurality, including the identified page. The layout models may be maintained in a respective storage such as file storage, database storage, cloud storage or the like, and formatted and stored in any of a number of different manners according to the respective storage.

The layout models may include any of a number of different types of layouts for panoptically arranging pages. As indicated above and explained further below, examples of suitable layout models include brickwall, partial brickwall, hierarchy, shape, center out, top-down/triangulated, center-out triangulated, size dominance, overlap through detail, master-detail through depth, load shape, facet, mixed-media/static-and-dynamic or the like. Other examples may include combinations of one or more of the foregoing layout models.

The layout engine 308 may be configured to select the layout model in any of a number of different manners. In one example, the layout engine may be configured to select the layout model according to the associated metadata for the identified page. The search engine 302 may therefore be configured to communicate the associated metadata for the identified page to the layout engine, which in turn, may be configured to select a layout model according to the respective associated metadata.

As explained above, the associated metadata for a page may provide information about the type of document of which the page is a constituent, and/or information about media content of the page. In one example, then, the layout engine 308 may be configured to select the layout model according to the type of the document of which the identified page is a constituent (e.g., computer-aided design document, presentation document, graphics document, video document, legal document, book, article, web page, engineering diagram(s), technical drawing(s), wiring diagram(s), etc.). In another example, the layout engine may be configured to select the layout model according to the media content of the identified page, such as one or more of its subject(s) and/or object(s).

As also explained above, the associated metadata for a page may include information identifying link(s) between the page and other page(s) of the collection. The layout engine 308 may therefore also be configured to retrieve the identified page and other page(s) identified according to the associated metadata for the identified page. These pages may be retrieved from respective storage 304.

In one example, the associated metadata for a page may include information about one or more content restrictions applied or to be applied to the page, such as access restrictions, editing or modification restrictions, and/or encryption of the page. In the context of an IPC for a complex system, for example, content restrictions may be applied on one or more bases such as organization, type of or individual complex system, element of the complex system or the like. In this example, the document layout system 300 may request or otherwise receive information regarding the user requesting the media content. This information may include identification of the user and/or any credentials of the user, which may be received from the user or stored in a user profile matched to the user's identification.

In the foregoing example, the layout engine 308 may then be configured to retrieve the identified page and other page(s) in accordance with the user information and content restrictions to be applied to the respective pages. In this regard, a user affiliated with an organization may be restricted to only page(s) in which their associated metadata allows access to the respective organization, or perhaps to a type or individual complex system that may be associated with that particular organization. In another example, a user associated with element(s) of the complex system with which the user is particularly knowledgeable may be restricted to only those page(s) depicting the respective element(s). In these instances, views of the layout and thus its pages may be configurable in a number of different manners according to content restrictions placed on the pages.

The layout engine 308 may be configured to generate a layout of the retrieved pages, panoptically-arranged according to the selected layout model, and the retrieved pages and their associated metadata. In addition to retrieving the pages, then, the layout engine of one example may also be configured to receive the associated metadata, such as from respective storage 306. The layout engine may then be configured to communicate the layout, such as to a GUI in which a layout may be displayed, or a printer for generating a printout of the layout.

As suggested, the layout may define a panoptic arrangement of the retrieved pages according to the selected layout model. In the arrangement of the layout, the pages may each have a particular size, location and/or depth (z-order). The size, location and/or depth of each page of the layout may be absolute or relative to other page(s) of the layout, and may be specified or otherwise determinable in a number of different manners. In one example, the sizes, locations and/or depths may be specified or otherwise determinable from a definition of the selected layout model of the layout models. Additionally or alternatively, for example, the associated metadata for each page of the layout may provide information specifying the size, location and/or depth (z-order) of it in the layout, as explained above. In these examples, the layout engine 308 may be configured to generate the layout according to the sizes, locations and/or depths specified by the selected layout model and/or associated metadata of the pages of the layout.

The aspect ratios of the pages may be their native aspect ratios. In various instances, however, a layout model may specify or otherwise define, for each of one or more pages, an aspect ratio that is different from the native aspect ratio of the respective page. In these instances, the layout engine 308 may be further configured to generate the layout according to the different, non-native aspect ratio(s) for the page(s).

In one further example, one or more of the pages of the layout may be in a state including visual representations (e.g., sub-images) at respective resolutions. For each of these pages, the layout engine 308 may be configured to retrieve the page for the visual representation at the resolution that matches or most closely matches the size specified by the selected layout model and/or associated metadata. This may include, for example, retrieving the sub-image of the page at or closest to the respective resolution.

The layout generated by the layout engine 308 may be dynamically generated according to a selected layout model such that a different layout of the pages may be realized by changing the selected layout model. A different layout may also be realized in a number of other manners, such as based on associated metadata of the pages of the layout or one or more time-based factors. In one example, the layout engine may therefore be further configured to receive a request for a different panoptic arrangement of the retrieved pages. In this example, the layout engine may be configured to select a different layout model from the plurality of layout models in response to the request. The layout engine may then be configured to generate a different layout of the retrieved pages. This may include the layout engine being configured to panoptically rearrange the retrieved pages according to the selected different layout model, and the retrieved pages and associated metadata for the retrieved pages.

As indicated above, the layout models may include any of a number of different types of layouts for panoptically arranging pages. In the layout models, logical relationship(s) established by link(s) between pages may be expressed by the arrangement of pages, in either or both of location or depth (z-order). In one example, logical relationships may be expressed by the proximity of pages to one another in their locations, and/or in their relative depths. Additionally, one or more of the layout models may define or imply a navigation path between documents related to one another, and/or a load shape for loading pages of a layout generated according to the respective layout models. Reference will now be made to FIGS. 5-16, which schematically illustrate examples of suitable layout models. As shown, these examples include brickwall, partial brickwall, hierarchy, shape, center out, top-down/triangulated, center-out triangulated, size dominance, overlap through detail, master-detail through depth, load shape, facet, mixed-media/static-and-dynamic or the like.

Figure 5:
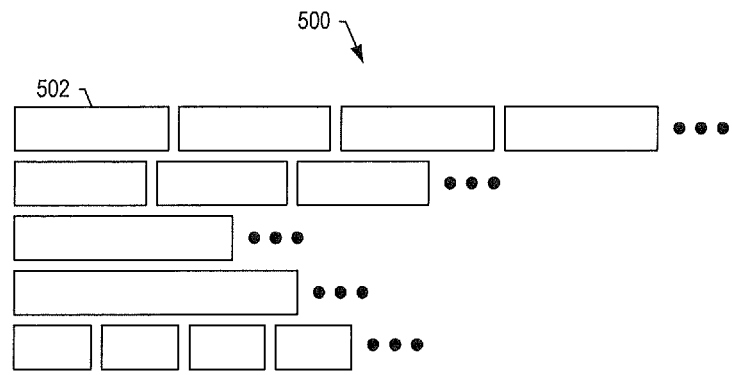

FIG. 5 illustrates a brickwall layout model 500 according to one example embodiment in which pages 502 may be arranged in one or more rows and one or more columns. As shown, the brickwall layout model may be characterized by a consistent end-to-end orientation with the pages being consistent in size and/or aspect ratio along one or more rows and/or columns. This type of layout model may be used for general search results. In one example, the layout model may provide a horizontal orientation related to chapter location, with a vertical orientation associated with a progressive increase in page length.

Although not separately shown, a partial brickwall layout model may be considered a superset of the brickwall layout model 500. The partial brickwall layout model may be characterized by clusters of pages that may similarly be consistent in size and/or aspect ratio at least within respective clusters. In this layout model, the clusters may be related by associated metadata of the respective pages, such as by their media content, author, time of creation, last revision or the like.

Figure 6:
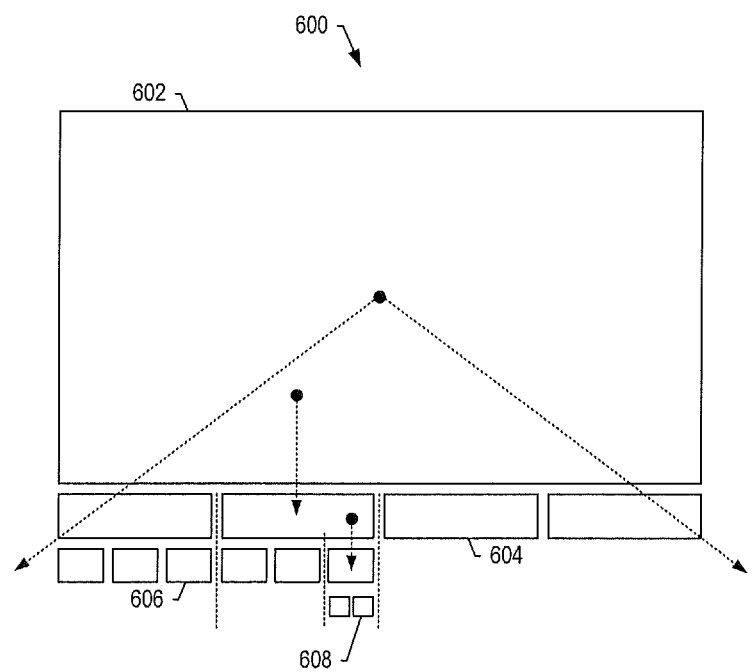

FIG. 6 illustrates a hierarchy layout model 600 according to one example embodiment in which pages may be arranged in a hierarchy in location and/or size. A hierarchical relationship between pages (hierarchically-related pages) may be indicated by their associated metadata in a number of different manners. For example, a hierarchical relationship may be indicated by a parent-child relationship between pages. In another example, a hierarchical relationship may be indicated by an object-subject or subject-object relationship in which an object of one page higher in a hierarchy may be subject(s) of other page(s) lower in the hierarchy, and in which at least some of the respective other page(s) may be at the same level in the hierarchy. In this example, the subject of the one page may be a master view, and the subject(s) of the other page(s) may be detailed view(s) of object(s) of the master view. In yet another example, a hierarchical relationship may be indicated by a relationship in which one page higher in a hierarchy includes reference(s) or link(s) (e.g., citation, hyperlink, etc.) to other document(s) lower in the hierarchy, in which at least some of the respective other document(s) may be at the same level in the hierarchy.

In one example of the hierarchy layout model 600, pages higher in a hierarchy may be located above those lower in the hierarchy (top-down), and/or may be larger in size than those lower in the hierarchy. The pages in this layout model may not be consistent in size or aspect ratio. Those pages higher in the hierarchy may dominate those lower in the hierarchy, and in which pages lower in the hierarchy may be constrained in the x-direction by the width of pages higher in the hierarchy.

More particularly, for example, the highest page 602 in the hierarchy may be located at the top, and may be sized according to the page's full resolution with its native aspect ratio. The next-highest page(s) 604 in the hierarchy may be located immediately below the highest page at a size smaller than the highest page, and with an aspect ratio that constrains the next-highest page(s) collectively to the width of the highest page. This pattern may repeat for the third-highest page(s) 606 in the hierarchy below respective ones of the next-highest pages, for the fourth-highest page(s) 608 in the hierarchy, and so forth. This layout model may in one example provide a single page with related pages cited in the respective page below it.

Figure 7:
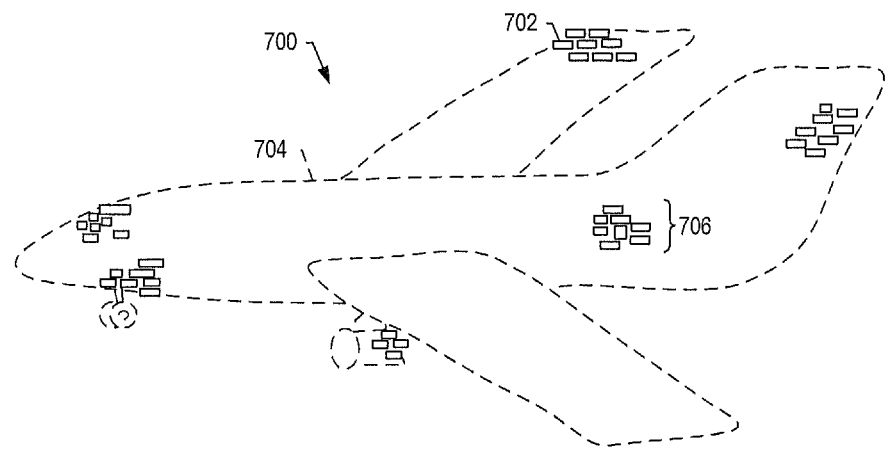

FIG. 7 illustrates a shape layout model 700 according to one example embodiment in which the model mimics a physical structure to which the pages relate, such as an aircraft or the geography of the United States. In one example, pages 702 may be arranged within boundaries of a visual representation 704 of the physical structure (two or three-dimensional representation), where the location(s) of page(s) may coincide with relationship(s) their media content to the structure. For example, pages related to the wing tip area of an aircraft (e.g., by subject or object) may be located in the respective area of the visual representation of the aircraft. In another example, pages related to court decisions from different states of the United States may be located in areas of the visual representation of the United States coinciding with the states in which the decisions were rendered.

In the shape layout model 700, in various instances, one or more subsets of the pages may be arranged in clusters 706 at respective areas of the visual representation of the physical structure. In these instances, the clusters may each be arranged according to another of the layout models, both in terms of location and size of the pages of the cluster.

Figure 8:
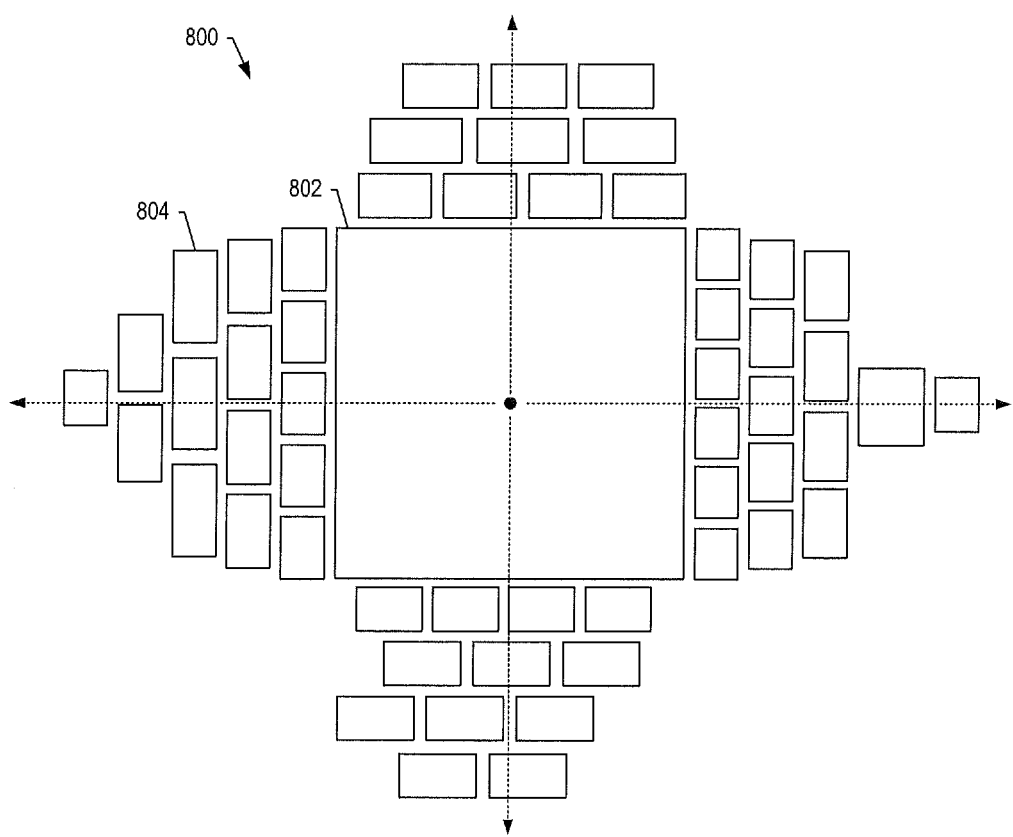

FIG. 8 illustrates a center-out layout model 800 according to one example embodiment. This layout model may be characterized by a dominating, centrally-located primary page 802—such as a page identified by a search engine (e.g., search engine 302) searching for media content. Pages 804 related to the primary page (e.g., hierarchically-related) may be located around the primary page in a 360-degree arrangement. The pages in this layout model may not be consistent in size or aspect ratio. In one example, this layout model may indicate that the primary page has a relation to pre (upper), post (lower) and contemporaneous (beside) pages. An example of this type of layout may be a collection of documents or web pages that have been cross-hyperlinked together with the pages being part of a document tree that leads to the center, primary page.

Figure 9:
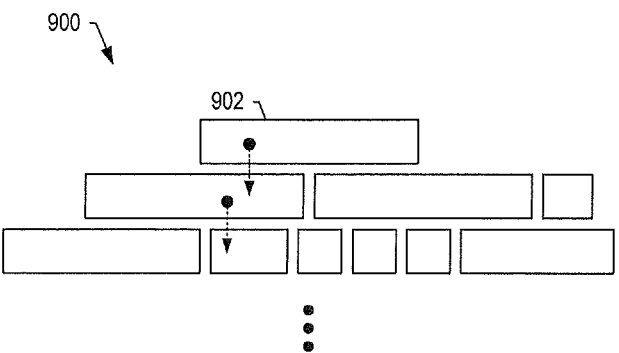

FIG. 9 illustrates a top-down/triangulated layout model 900 according to one example embodiment. This layout model may be similar to a combination of the brickwall layout model 500 and hierarchy layout model 600, and may be characterized by a top-down arrangement of hierarchically-related pages 902. Similar to the brickwall layout model, the pages in this layout model may be consistent in size and/or aspect ratio at least within pages at the same level of the hierarchy, which may indicate the importance of the pages relative to one another. Similar to the hierarchy layout model, in one example, pages higher in the hierarchy may be above (in the y-direction) pages lower in the hierarchy; but in contrast to the hierarchy layout model, the widths of the lower pages may not be constrained by the higher pages in the x-direction. In one example, the top-down/triangulated layout model may provide a single page as a node in a graph tree of related pages.

Figure 10:
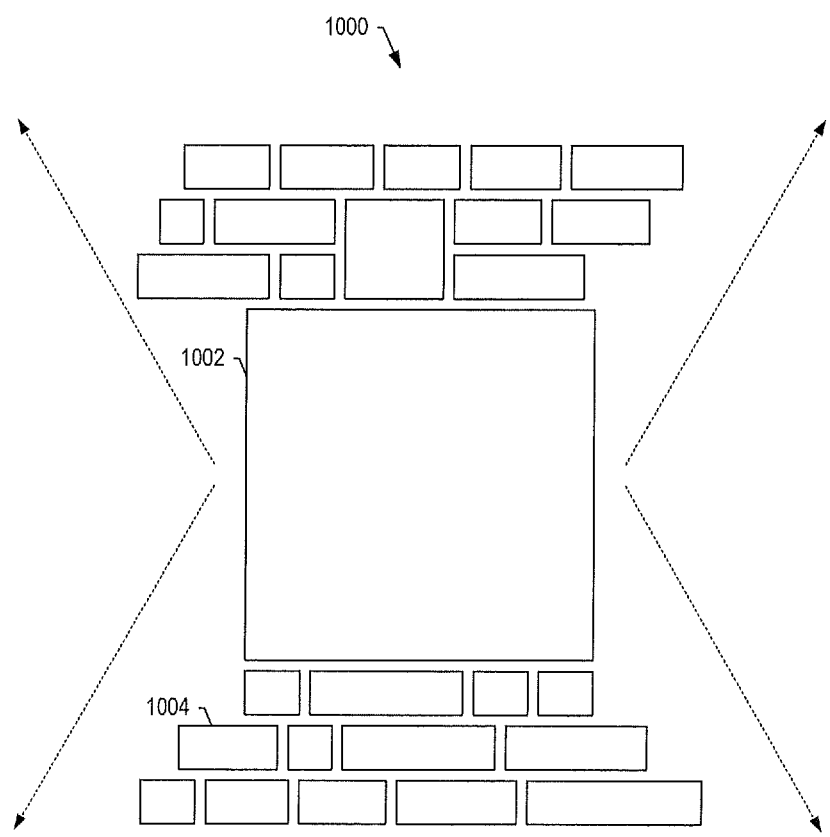

FIG. 10 illustrates a center-out triangulated layout model 1000 according to one example embodiment. This layout model may be characterized by a dominating, centrally-located primary page 1002, similar to the center-out layout model 800. In the center-out triangulated layout model, pages 1004 related to the primary page (e.g., hierarchically-related) may be located above and/or below the primary page. Also similar to the center-out layout model, the pages of the center-out triangulated layout model may not be consistent in size or aspect ratio. The center-out triangulated layout model may indicate that the primary page has a relation to the pre (upper) and post (lower) pages. An example of this type of layout may be a collection of documents or web pages that have been hyperlinked together with the upper pages being part of the document tree that leads to the center, primary page, and the lower pages leading from the primary page.

Figure 11:
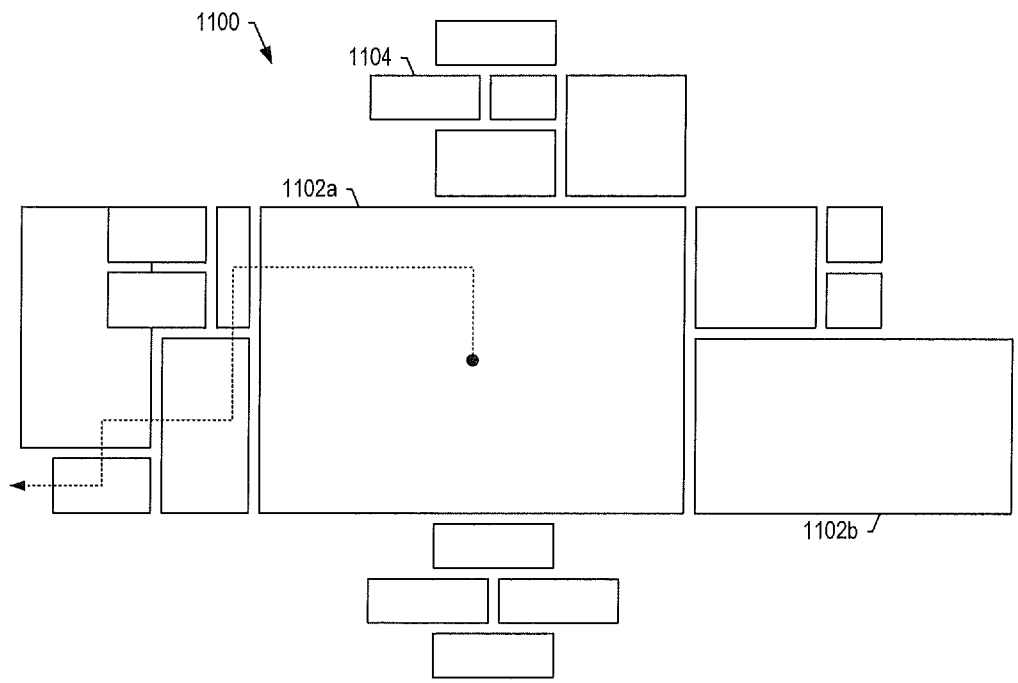

FIG. 11 illustrates a size-dominance layout model 1100 according to one example embodiment. This layout model may be similar to the center-out layout model 800. In this regard, the size-dominance layout model may be characterized by a dominating, centrally-located primary page 1102, and pages 1104 related to the primary page (e.g., hierarchically-related) located around the primary page in a 360-degree arrangement. This layout model, however, may include more than one primary page that may be the same size or different sizes, with two such pages 1102a, 1102b being shown. The pages in this layout model may not be consistent in size or aspect ratio. The size of the pages in this layout model may convey weight or relevance of the pages relative to one another. An example of this type of layout may be a collection of wiring diagrams that have associated reference(s) or link(s) on all four axes of at least the primary diagrams. The referenced/linked wiring diagrams/schematics may themselves include relationships to additional diagrams.

Figure 12:
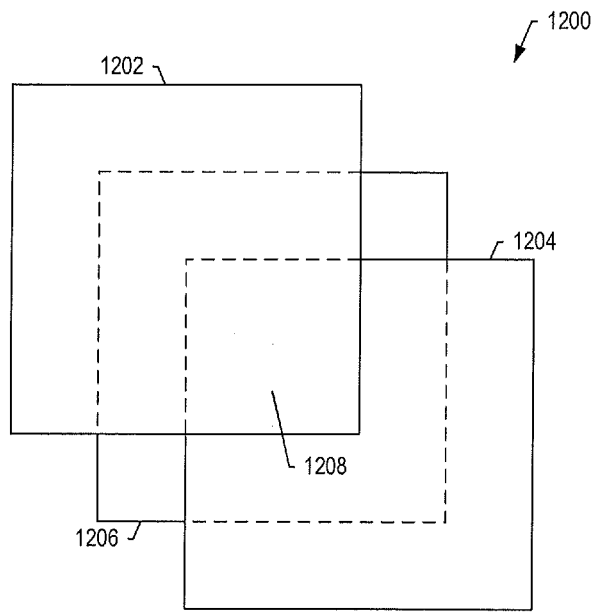

FIG. 12 illustrates an overlap-through-detail layout model 1200 according to one example embodiment. This layout model may be characterized by preservation of a hierarchical relationship between pages in the depth (z-order) in which they are arranged. In one example, a page 1202 higher in the hierarchy may overlay another page 1204 lower in the hierarchy, which in turn may overlay another page 1206 even lower in the hierarchy. In this layout, pages sharing one or more common objects or other media content may overlap 1208 so that the shared object(s)/other media content may at least partially spatially align across the pages.

Navigating a layout (or more particularly its visual presentation) may include zooming into or out of the presentation. Zooming into the layout according to the overlap-through-detail layout model 1200 may include increasing the size and, in various instances of one example, resolution of its pages. In this layout model, however, zooming into the layout may also include obscuring an overlaying page so that one or more overlaid pages (or rather the overlaid portions thereof) underneath it may come into view. Conversely, zooming out of a layout may also include showing an obscured overlaying page so that the respective page comes into view, and one or more overlaid pages (or rather the overlaid portions thereof) go out of view. In one example, obscuring a page may include increasing a transparency of the page (or decreasing its opacity) during a zoom-in, and showing a page may include increasing an opacity of the page (or decreasing its transparency) during a zoom-out.

In one example, as shown in FIG. 12, in an overlap-through-detail layout model 1200 including pages 1202, 1204, 1206, page 1202 may be obscured as a user zooms into the layout. At some point during the zoom-in, then, the respective page may no longer be viewable so that the layout appears to only include pages 1204, 1206. The zoom-in may further continue, obscuring page 1204 until it is no longer viewable, at which point the layout appears to only include page 1206. In these instances, obscured pages may remain in the layout, or the layout engine 308 may be configured to remove them from the layout.

Continuing the example of FIG. 12 in which only page 1206 is viewable and pages 1202, 1204 are obscured, page 1204 may be shown overlaying page 1206 as a user zooms out of the layout. At some point during the zoom-out, the respective page may be viewable so that the layout appears to include both pages 1204, 1206. The zoom-out may further continue, showing page 1202 until it is also viewable, at which point the layout appears to include pages 1202, 1204, 1206. In these instances, overlaid pages (or the overlaid portions thereof) may remain in the layout, or the layout engine 308 may be configured to remove them from the layout.

FIG. 13 illustrates a master-detail through depth layout model 1300 according to one example embodiment. This layout model is similar to the overlap-through-detail layout model 1200 in that a hierarchical relationship between pages may be preserved in their depth (z-order). In this layout model, however, an overlaid page (e.g., lower in the hierarchy) may be sized and arranged to be coincident with the entirety of an overlaying page (e.g., higher in the hierarchy).

Similar to the overlap-through-detail layout model 1200, navigation in the master-detail through depth layout model 1300 may include zooming into or out of the layout, which may further include obscuring or showing an overlaying page relative to an overlaid page. In the example shown in FIG. 13, navigating a layout including pages 1302, 1304, 1306 may include obscuring overlaying pages as a user zooms into the layout. Conversely, navigating the layout may include showing overlaying pages as the user zooms out of the layout. In this regard, implementing a zoom in the master-detail through depth layout model of multiple pages may be similar to implementing a zoom for a page including multiple sub-images.

Figure 14:
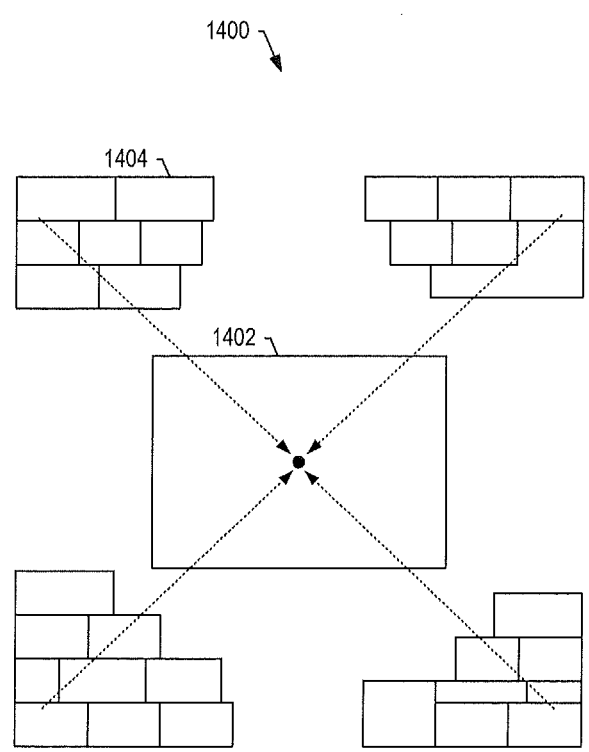

FIG. 14 illustrates a load-shape layout model 1400 according to one example embodiment. This layout model may be similar to some of the other layout models (e.g., center-out, center-out triangulated) including a dominating, centrally-located primary page 1402, and pages 1404 related to the primary page (e.g., hierarchically-related) located around, above and/or below the primary page. The pages in this layout model may not be consistent in size or aspect ratio. The load-shape layout model may be characterized by the timing of loading the layout (or more particularly its visual presentation). In this layout model, the non-primary pages may be loaded first, followed by the primary page.

An example of the load-shape layout model 1400 may be pages of media content related in time where pages of older media content may be loaded before the primary page of the most-current media content. The timing of media content in this context may relate to a time-aspect of the subject(s) or object(s) of the media content. For example, pages (e.g., pages 1404) for the preceding history of a court decision may be loaded before the court decision (e.g., page 1402) itself. In another example, the timing of media content may relate to the time of creation of the content, such as in the case of loading a first draft and one or more changes or revisions to a document (e.g., pages 1404) before the final or current version of the document (e.g., page 1402).

Figure 15:
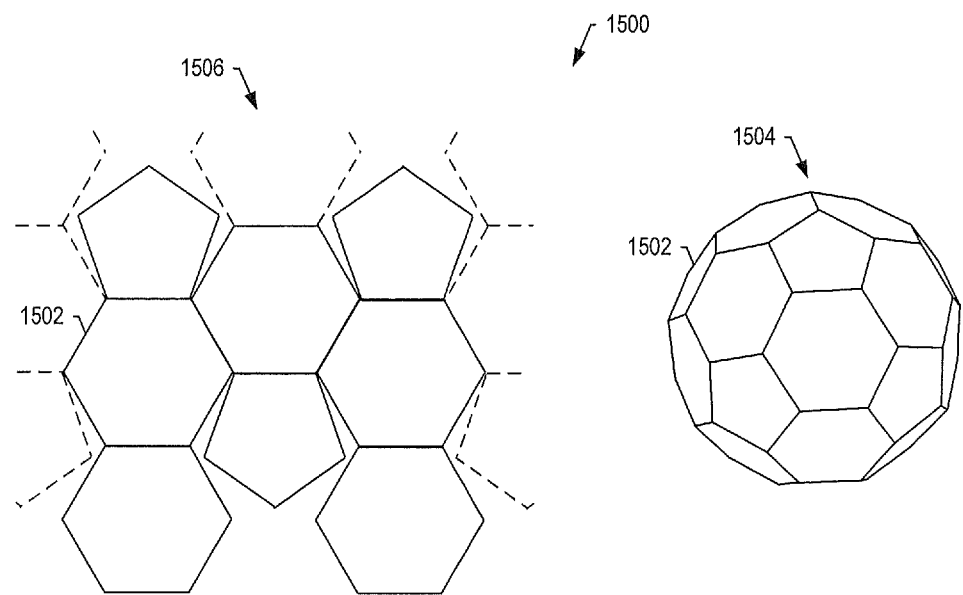

FIG. 15 illustrates a facet layout model 1500 according to one example embodiment. The facet layout model may be characterized by the arrangement of pages 1502 in a three-dimensional (3D) environment, such as in the context of facets of a 3D structure such as a truncated icosahedron 1504. For example, each page may be created from a set of x, y, z coordinates with a known consistent unit vector for orientation. Each page may then be placed in the layout in relation to a viewer's perspective. This layout model may be visually presented in three dimensions, or may be translated to a corresponding two-dimensional (2D) arrangement, such as a translated truncated icosahedron 1506.

Figure 16:
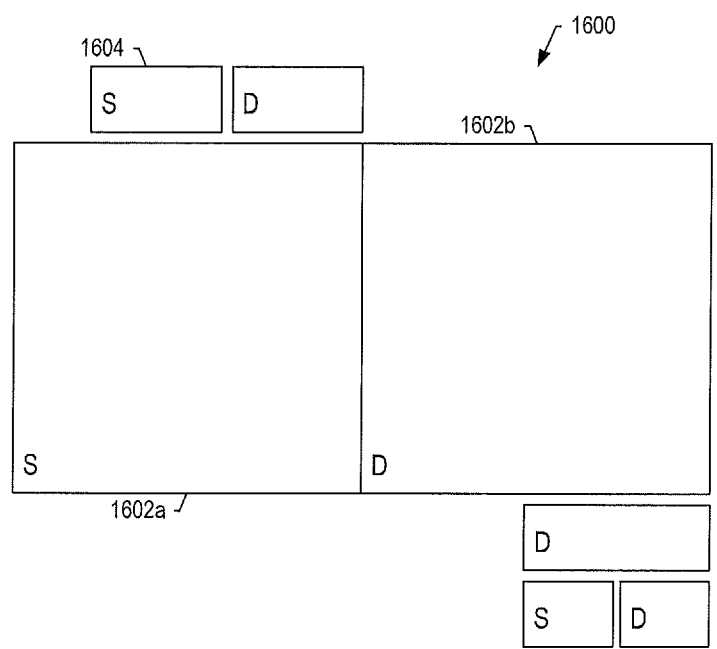

FIG. 16 illustrates a mixed-media/static-and-dynamic layout model 1600 according to one example embodiment. This layout model may be a subset of one or more other layout models in which the pages of a layout may include pages of mixed media types. For example, this layout model may include one or more static ("S") pages such as in the case of textual content or still images, and one or more dynamic ("D") pages such as in the case of video. FIG. 16 illustrates for example the mixed-media/static-and-dynamic layout model arranging mixed-media content in an arrangement similar to the size-dominance layout model 1100. As shown, this arrangement may include dominating, centrally-located primary pages 1602a, 1602b, and pages 1604 related to the primary pages (e.g., hierarchically-related) located around the primary pages.

Now turning back to FIG. 4, a document navigation system 400 is shown according to one example embodiment. As indicated above, the document navigation system 400 may be one example of the document navigation system 106 of the panoptic visualization system 100 of FIG. 1. The document navigation system may be generally configured to select and provide navigation option(s) for navigating a layout of panoptically-arranged, logically-related pages of a panoptic visualization document collection. In one example, this may include the collection from the document collection system 102 (e.g., document collection system 200). Additionally or alternatively, for example, it may include the layout generated by the document layout system 104 (e.g., document layout system 300).

As shown in FIG. 4, the document navigation system 400 may include a navigation engine 402 configured to receive a layout of pages (document components) of a panoptic visualization document collection. The collection may have a plurality of pages each of which includes respective media content and have associated metadata providing information about the respective page. The layout may include a panoptic arrangement of visual representations of the pages of the layout according to the associated metadata of the respective pages.

The navigation engine 402 may also be configured to select one or more navigation options from a plurality of navigation options for navigating the layout, in which the navigation options may be selected according to the associated metadata for the pages of the layout. The navigation options may be maintained in a respective storage such as file storage, database storage, cloud storage or the like, and formatted and stored in any of a number of different manners according to the respective storage. Similarly, the metadata for the pages of the layout may be stored in a respective storage 404, which in one example may correspond to either or both of storage 208, 306. The navigation engine may also be configured to communicate the selected navigation options, such as to a GUI in which the selected navigation options may be presented along with the layout.

In one example, the navigation engine 402 may be configured to select navigation options according to the type(s) of document(s) of which the pages of the layout are constituents, which may be indicated in the associated metadata for the pages. In one example, the navigation engine may be configured to select navigation options according to the media content of the pages of the layout, such as their subject(s) and/or object(s), which may also be indicated in the associated metadata. Examples of suitable navigation options for a layout include command tools (e.g., pan, rotate, zoom, obscure/show, home, etc.), annotation tools (e.g., timeline/milestone, callout, etc.), linking tools (hyperlink, hotlink, hotspot, etc.), navigation path tools (e.g., tracking, recording, etc.), metadata tools (e.g., search, filter, insertion, etc.), page tools (e.g., search, filter, cue, activation, size, location, dominance, logical relationship(s), etc.), layout-model change, co-navigation, hyper-hypo navigation, printing or the like.

The associated metadata for the pages of the layout may directly or indirectly affect the selected navigation options. In one example, the associated metadata may be retrieved to directly affect the navigation options selected by the navigation engine 402. Additionally or alternatively, for example, the associated metadata for the pages may affect their layout, such as by affecting a selected layout model according to which the layout may be generated. More particularly, for example, the layout of pages may be generated according to a layout model selected according to the type of document(s) of the pages, and/or media content of the pages. The layout may then affect the navigation options selected by the navigation engine. In either event of the associated metadata directly or indirectly affecting the selected navigation options, the navigation engine may be said to select navigation options according to the associated metadata for pages of the layout.

The document navigation system 400 may also include a request interface 404 coupled to the navigation engine 402 and configured to receive a request according to one or more of the selected navigation options. The request interface may be configured to communicate the request to the navigation engine. The navigation engine may in turn be further configured to effect an adjustment of the visual representation of the layout in response to the request and according to the request, and communicate the adjustment such as to the aforementioned GUI. In one example, the navigation engine may be configured to effect the adjustment of the visual representation without adjustment of the layout itself. In another example, the navigation engine may be configured to effect the adjustment of the visual representation including adjustment of the layout.

As suggested above, the selected navigation options may be affected by a layout and/or its pages, or in one more particular example, the associated metadata for the pages of a layout. In various instances, then, layouts of different pages may result in the selection of one or more different navigation options. For example, consider that the navigation engine 402 may at different times receive a layout of first pages and a separate layout of second pages, with each layout including a panoptic arrangement of respective pages. In this example, the navigation engine may select first navigation options for the first layout, and second navigation options for the second layout. The first and second pages may include one or more common pages, but in one example, may also include one or more different pages. In this example, the first and second layouts may be different at least in that the first and second pages include one or more different pages. And in turn, the first and second navigation options selected by the navigation engine may include one or more different navigation options—although similar to the first and second pages, the first and second navigation options may include one or more common navigation options.

The navigation engine 402 may be configured to select any of a number of different navigation options for a layout of pages. Many layouts generated according to many different layout models, and including pages of many different types of documents, may include command tools such as pan, rotate, zoom, obscure/show, home or the like. In various instances, a portion but not all of a layout may be viewable in a GUI in which the layout is displayed. This may be the case, for example, in instances in which the size of the layout is greater than the viewable area of the GUI (sometimes referred to as a "view"), or in instances in which the layout is of pages in a 3D environment (e.g., facet layout model). In these instances, the navigation options may include panning and/or rotating to move the layout. This may include one or more pages of the layout coming into view, and may additionally or alternatively include one or more pages going out of view. Pages of the layout in view or coming into view may be retrieved and displayed, while pages out of view or going out of view may be removed from display. Further, in instances in which only a portion of a page is in view or comes into view, and in which pages are divided into tiles, only those tiles covering the viewable portion of the page may be retrieved and displayed.

The command tools may also include zooming into or out of a layout and thus its pages, which may include increasing or decreasing the size of the layout. This increasing or decreasing the size of the layout may in turn include increasing or decreasing the size(s) and, in various instances of one example, the resolution(s) of its pages.

In one example, pages of a layout may include sub-images at respective resolutions for zoom levels of the pages. In this example, the layout may include for each respective page, the sub-image of the page at the resolution that matches or most closely matches the page's size specified by a selected layout model and/or associated metadata. A zoom-in of the layout, then, may be effectuated by replacing the sub-images of its pages with respective sub-images at increased zoom levels, and hence increased resolutions. Conversely, a zoom-out of the layout may be effectuated by replacing the sub-images of its pages with respective sub-images at decreased zoom levels, and hence decreased resolutions.

In various examples, the zoom (in or out) of a page or layout may be capable at a finer increment than provided by zoom levels of the page or one or more pages of the layout. The zoom of a page (alone or as part of a layout) may be to an increment that relative to a sub-image of the page being displayed, another sub-image of the page matches or most closely matches the page's increased/decreased size. In these instances, for example, the zoom may be effectuated by replacing a sub-image of the page with a corresponding sub-image of the page at a higher/lower resolution. In other instances, however, the zoom may be to an increment that relative to a sub-image of the page being displayed, the same sub-image still most closely matches the page's increased/decreased size. In these instances, for example, the zoom may be effectuated by increasing the size of the sub-image of the page without replacing the sub-image with another at a higher/lower resolution.

In a further example, a page may not only include respective sub-images, but the sub-images across zoom levels may be divided into progressively larger numbers of tiles each of which covers a spatial area of the sub-image at a respective zoom level. In this example, a zoom-in of the layout may be effectuated by replacing the displayed tile(s) of its pages with the increased numbers of tiles covering the pages at higher zoom level(s). Conversely, a zoom-out of the layout may be effectuated by replacing the displayed tiles with the decreased numbers of tile(s) covering the pages at lower zoom level(s). Similar to panning a layout, zooming into or out of a layout may include one or more pages of the layout coming into view, and may additionally or alternatively include one or more pages going out of view. These pages may be handled in a manner similar to panning the layout, but at higher or lower zoom level(s).

In addition to increase or decrease in size/resolution of pages of a layout, for one or more layouts, the zoom option may implicate one or more other navigation options to further affect one or more of the pages. For example, the overlap-through-detail layout model 1200 and master-detail through depth layout model 1300 may implicate obscure/show options in which overlaying pages may be obscured or shown relative to overlaid pages during zoom-in and zoom-out, such as in the manner explained above with reference to FIGS. 12 and 13. It should be understood, however, that the obscure/show options may be utilized to obscure or show one or more pages of a layout independent of the zoom option, and independent of pages overlaying one another.

A number of navigation options including those command tools described above may effect an adjustment of the visual presentation of a layout. A home option may therefore permit a user to return to the visual presentation from the adjusted visual presentation.

The navigation options may include annotation tools such as timeline/milestone, callout or the like. These tools may permit a user to add annotations to a layout, and may be selected for a number of different layouts to different layout models, and including pages of many different types of documents. The timeline/milestone option in various examples may be more particularly applicable to pages logically related to one another in a time sequence. In one example, timeline/milestone may effect a visualization added to the layout that may relate pages of the layout as milestones in a timeline.

The navigation options may include linking tools such as hyperlink, hotlink, hotspot or the like. In accordance with the hyperlink option, one or more pages (each a source) may include reference(s) or link(s) to other page(s) or media content of other page(s) (the page(s) or media content being a target). The target page(s) or media content may be in the same layout, or in the same panoptic visualization document collection but perhaps not in the same layout. The target may even include page(s) or media content not in the same panoptic visualization document collection.

The hyperlink option may permit a source page to include inline in its media content, content linked from one or more other pages. This is sometimes more particularly referred to as a hot link. The hyperlink option may also permit a user to navigate from a source page to one or more target pages linked to the respective source page. In this regard, a hyperlink may be represented in any of a number of different manners, such as by text, graphic or the like. For example, media content of one page may be formatted as a hyperlink to another page or media content of another page. More particularly, for example, an object depicted in one page may be formatted as a hyperlink to another page that also depicts the object, or more directly to the object depicted in the other page. This type of hyperlink is sometimes referred to as a hotspot.

As explained above in the context of an IPC, logical relationship(s) between pages may be reflected in the drawings and/or lists of the pages themselves. For example, drawings and/or lists depicting one or more elements may include references to identify the respective element(s), or identify other drawing(s) depicting the respective elements (partially or completely). In accordance with the hyperlink option, then, one or more references in a source page may be reconfigured as hyperlinks to target page(s), or drawing(s), list(s), element(s) or reference(s) of the target page(s). In a source drawing, for example, a reference to a target drawing depicting the same element(s) as the source drawing (partially or completely) may be reconfigured as a hyperlink to the target drawing. In addition to or in lieu of reconfiguring references to hyperlinks, drawings depicting common elements (partially or completely) may themselves may be reformatted to include one or more hotspots between the common element(s).

In addition to or in lieu of the foregoing, for example, the navigation options may include navigation path tools such as tracking, recording or the like. A navigation path according to example embodiments may be defined in any of a number of different manners. In one example, a navigation path may be defined by a sequence of a user panning, rotating, zooming and/or repositioning a layout or one or more of its pages, navigating from one page to another page or media content (hyperlink), or otherwise effecting an adjustment of the layout (or rather its visual presentation). The navigation path tools may permit tracking and/or recording a navigation path followed by a user, thereby creating a navigation history.

The navigation options of one example may include metadata tools such as search, filter, insertion or the like, which may operate with respect to the associated metadata for pages of the layout. The search and filter options may permit a user to search the associated layout for particular metadata, or filter the associated metadata to include or exclude particular metadata. The insertion option may permit the insertion of particular metadata to the visual presentation of the layout, such as in the form of a callout including the particular metadata referenced to page(s) for which the associated metadata includes the particular metadata.

The navigation options may include page tools such as search, filter, cue, activation, size, location, dominance, logical relationship(s) or the like. Similar to the metadata tools, the search and filter options may permit a user to search the pages of the layout for particular page(s) or particular media content. In this regard, the search and filter options may implicate the associated metadata for pages of the layout.

The cue option may permit the application of one or more visual effects to one or more pages to draw the user's attention to those page(s) in the layout. The visual effect may be any of a number of different effects. Examples of suitable visual effects include an opaque or translucent border of a noticeable color (e.g., yellow) around the page(s), an opaque or translucent visual object or shape smaller than and overlaying the page(s) or a translucent visual object or shape the same or greater in size than and overlaying the page(s), or the like. Examples of other suitable visual effects include an increase in a size of the page(s), an animation applied to the page(s), or the like.

The visual effect(s) may be triggered in any of a number of different manners, as may the page(s) to which the effect(s) are applied. For example, visual effect(s) may be triggered to indicate selection of one or more page(s). In this example, the visual effect(s) may be applied to the selected page(s). Additionally or alternatively in this example, visual effect(s) may be applied to page(s) having a particular logical relationship with the selected page(s) (e.g., share common document, subject and/or object, adjacency, object-subject subject-object, parent-child, reference/link, user specified, etc.). In another example, visual effect(s) may be applied to page(s) to indicate a navigation path followed by the user.

In the context of an IPC, for example, visual effect(s) may be applied to pages sharing a common IPC, or pages adjacent one another in order sequence in a common IPC. In other examples, visual effect(s) may be applied to pages depicting structurally-related elements. More particularly, for example, visual effect(s) may be applied to pages depicting the same element (partially or completely). Visual effect(s) may be applied to a page depicting the complex system, and other page(s) depicting the complex system's subsystems, parts or features. Visual effect(s) may be applied to a page depicting a subsystem, and other page(s) depicting the subsystem's parts or features. And in yet another example, visual effect(s) may be applied to a page depicting a part, and other page(s) depicting the part's features.

The activation option may be more particularly applicable to dynamic pages and may permit a user to trigger activity of one or more pages, such as by playing or otherwise controlling (e.g., rewind, fast forward, volume, mute, etc.) video content that may be included in such page(s).

Size, location and dominance options may permit a user to resize or otherwise rearrange one or more page(s) of a layout, which may in effect create a different layout. These options may be applicable to a number of different layouts to different layout models, and including pages of many different types of documents. In one example, however, the dominance option may be more particularly applicable to layouts according to a layout model including a dominating page, such as hierarchy, center out, center-out triangulated, size dominance, load shape, mixed-media/static-and-dynamic or the like.

The logical relationship(s) option may permit a user to add, delete or otherwise change one or more logical relationships between pages, which may in turn effect a change in the layout of pages. These changes may or may not carry from navigation of a layout of pages to the associated metadata of those pages and any other similarly related pages. Thus, in one example, the changes may be temporary in that they are only applied to the layout of pages currently being visually presented. In another example, the changes may be more permanent in that they result in corresponding changes to the associated metadata for pages, which may not only result in a change in the currently presented layout but other layouts generated including the affected pages.

Further examples of navigation options may include layout-model change, co-navigation, hyper-hypo navigation, printing or the like. The layout-model change option may permit the user to change the layout model according to which the visually presented layout has been generated. This option may result in a rearrangement of the pages of the layout according to another layout model, thereby generating another layout. The co-navigation option may permit users of different instances of the same system to collaboratively navigate a layout of pages that may have been generated by one of the systems, but may be concurrently visually presented by both systems. The hyper-hypo navigation option may permit navigation between unique layout states or other pages that may not be part of the same panoptic visualization document collection as pages of the layout (hyper navigation), and/or navigation with a single layout state that may change as a result of that navigation (hypo navigation). And the printing option may permit the user to direct the visually-presented layout to a printer for generating a printout of it.

Figure 17:
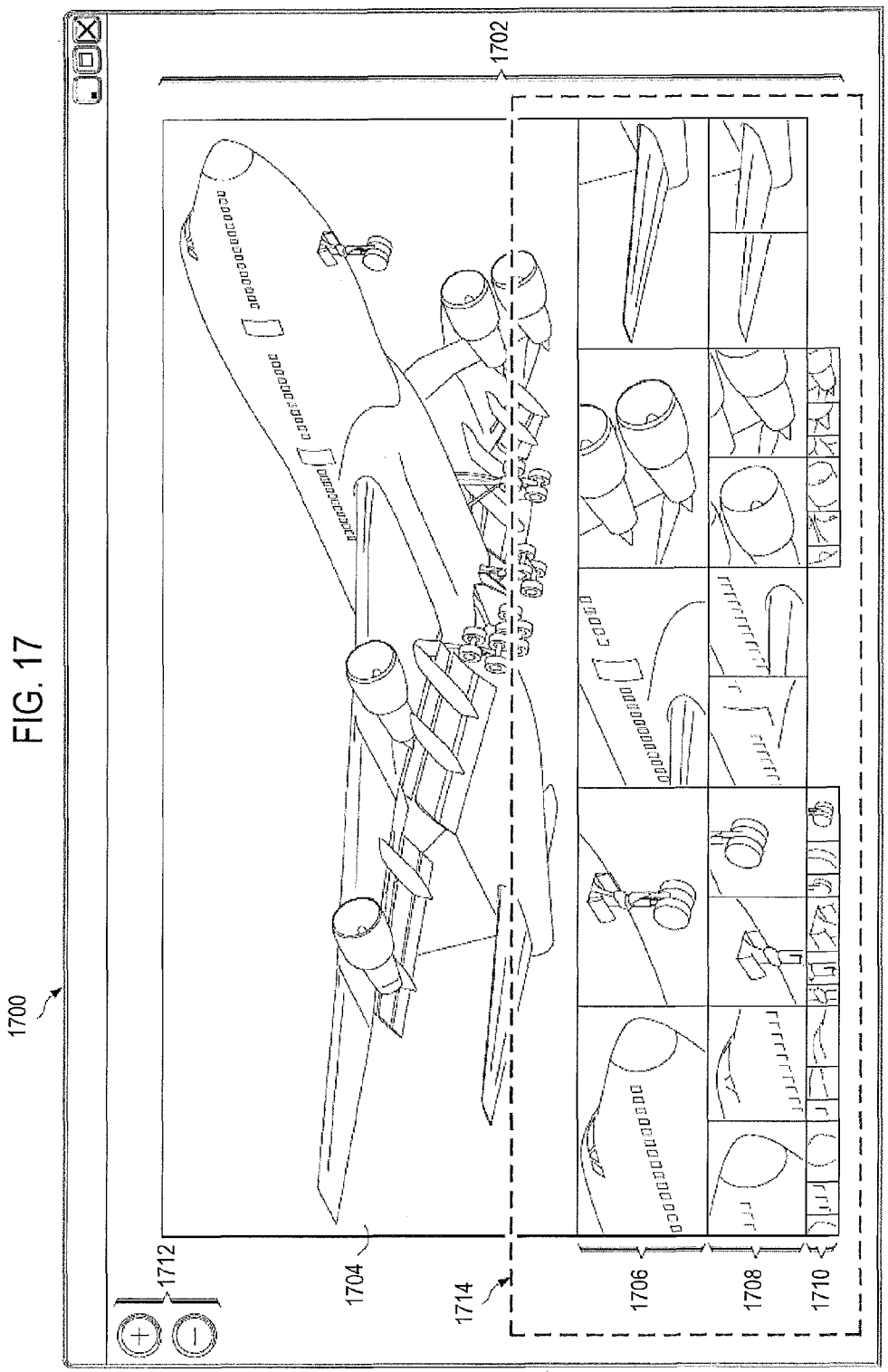
Figure 18:
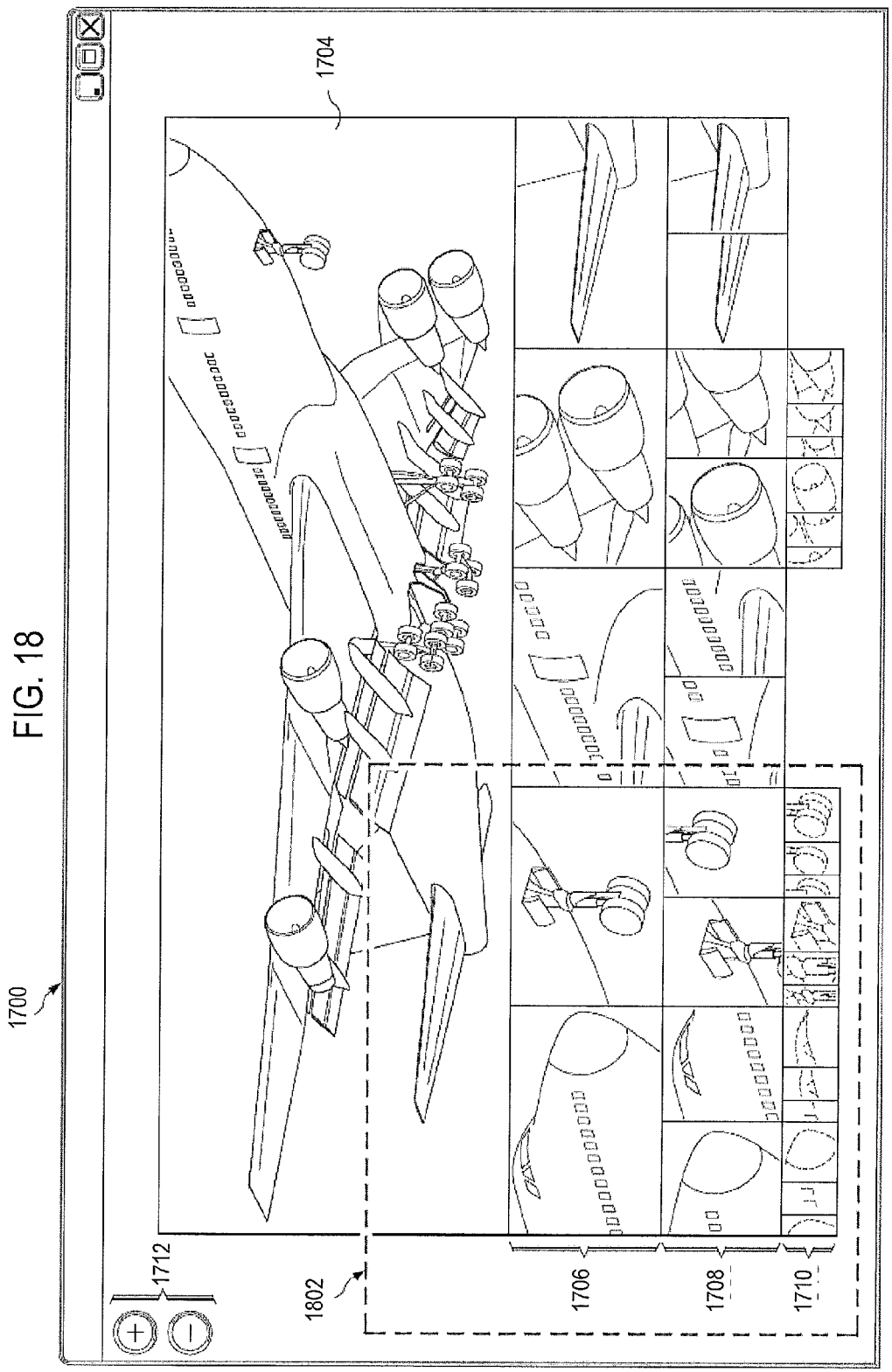
Figure 19:
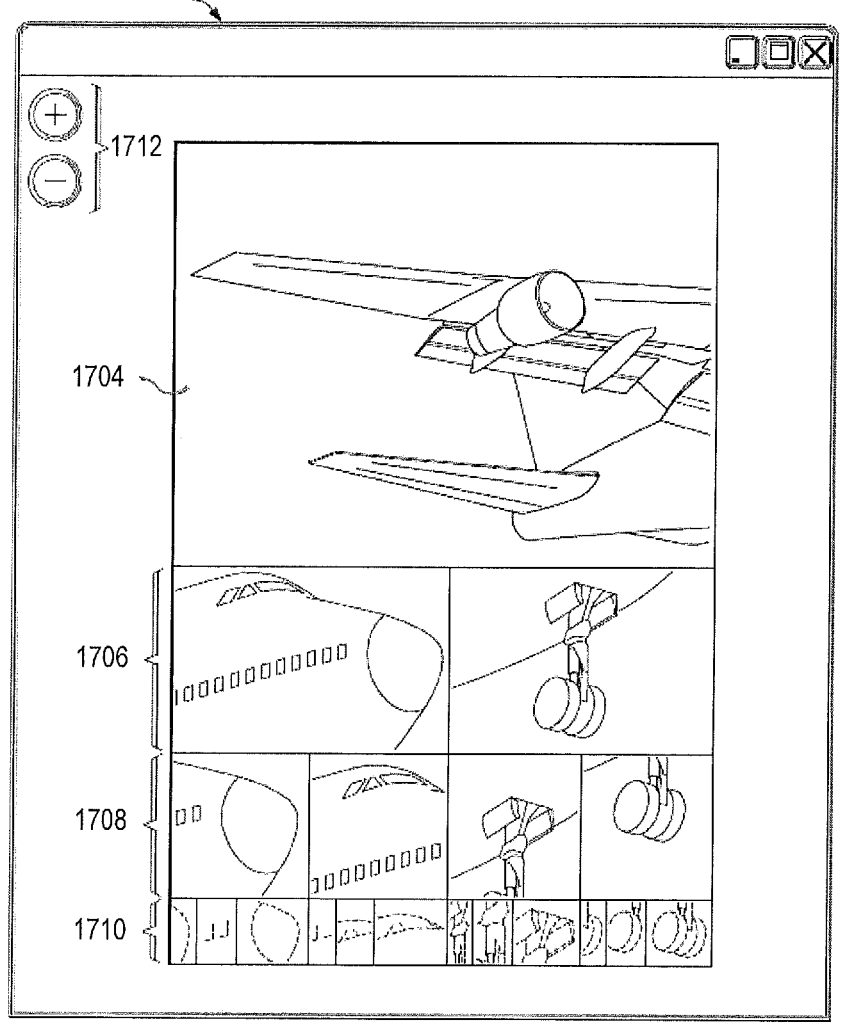

To further illustrate example embodiments of the present invention, reference will now be made to FIGS. 17-22, which depict example layouts of pages that may be displayed in a GUI that has a predetermined viewable area, and which may be navigated by a user, according to an example embodiment of the present invention. FIGS. 17-19 illustrate an example of a layout according to the hierarchy layout model 600 displayed in a GUI that has a predetermined viewable area 1700. As shown, a layout according to the hierarchy layout model may include a plurality of pages 1702, each of which in one example may be a sub-image of the page at a respective resolution. Various ones of the pages may have different resolutions in the layout, with page 1704 having a higher resolution than pages 1706, which in turn have a higher resolution than pages 1708, which again in turn have a higher resolution than pages 1710.

The pages may be located and/or sized in the layout according to logical relationship(s) between the pages. In the example shown, the pages 1702 are engineering drawings of an aircraft, and may have object-subject relationships. More particularly, for example, object(s) of a page on a level of the hierarchy may be subject(s) of pages below it in the hierarchy, the subject(s) in one example being additional detail regarding the object(s).

More particularly, for example, page 1704 may depict an exterior view of the entire aircraft. Pages 1706 may depict a nose section, a landing gear assembly, a window, an engine assembly and a tail assembly. Pages 1708 may depict additional detail about the content of respective ones of pages 1706, and pages 1710 may depict additional detail about the content of respective ones of pages 1708. In the viewable area 1700, however, pages 1708, 1710 may be presented at a resolution that causes their media content to be only partially understood or not understood at all by a user. Of course, in other example embodiments, pages 1708 and/or pages 1710 may be presented at a sufficient resolution to interpret substantially all of their media content.

The GUI may present one or more selected navigation options for navigating the layout of pages 1702. In this illustrative example, pan and zoom navigation options may be presented in the form of controls 1712 to move and/or increase the size of the pages in the viewable area 1700 to focus on a portion 1714 of the layout. In other words, the user may activate the aforementioned controls to move and/or zoom the layout to fill a greater portion of the viewable area of the GUI with a portion of the layout. FIG. 18 illustrates one example of the result of navigating the layout in this manner.

As shown in FIG. 18, as the user activates controls 1712 to focus on the portion 1714 of the layout, the size of pages 1704-1710 may increase which, in one example, may include replacing sub-images of pages 1704-1708 with corresponding sub-images at higher resolutions. The resolution of the sub-images may allow the user to interpret substantially all of the presented media content. In this view, however, pages 1710 may not be presented with sufficient resolution to be interpreted by the user, because the size of the respective pages may not have been increased to a level implicating a next sub-image. That is, even after having increased the size of the image, the size may still most closely approximate the same sub-image so as to not cause its replacement with the next sub-image at a higher resolution. In this illustrative example, the user may again activate controls 1712 to move and/or resize the view to focus on an even smaller portion 1802 of the layout.

One example of the result of navigating the layout to focus on portion 1802 is shown in FIG. 19. In one example, the viewable area 1900 of the GUI may resize to more fully accommodate the focused portion of the layout. As the user activates the controls 1712 to focus on the portion 1802 of the layout, the size of pages 1704-1710 may increase, which in one example, may now further include replacing a sub-image of page 1710 with a corresponding sub-image at a higher resolution. The media content of page 1710 may now be sufficient to be interpreted by the user. In one example in which only a portion of page 1704 is within the viewable area of the GUI, and in which the respective page is divided into tiles, only those tiles covering the viewable portion of the respective page may be retrieved and displayed.

Figure 20:
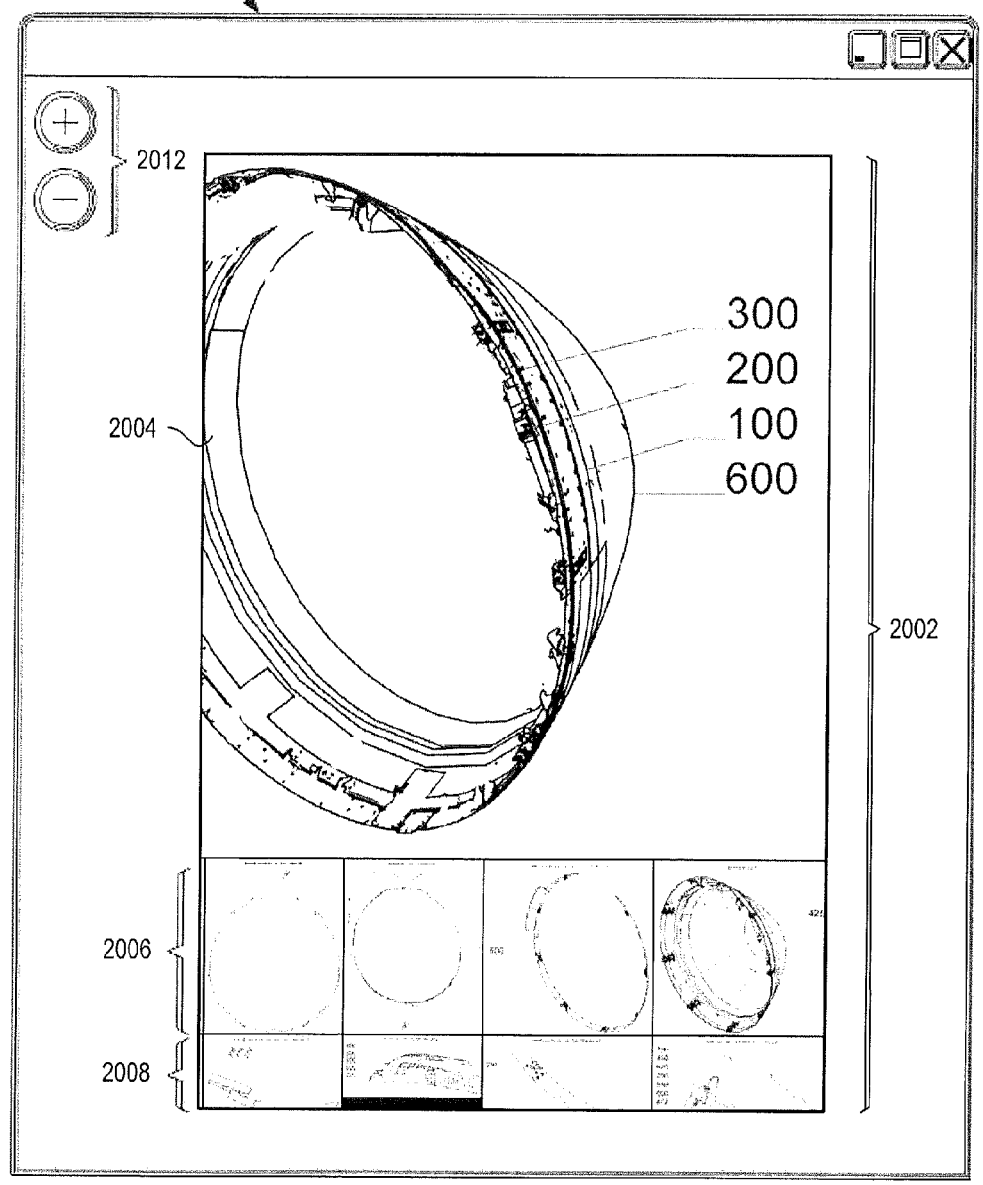

More particularly in the context of an IPC, FIG. 20 illustrates another example of a portion of a layout according to the hierarchy layout model 600 displayed in a GUI that has a predetermined viewable area 2000. As shown, a layout according to the hierarchy layout model may include a plurality of pages 2002, each of which in one example may be a sub-image of the page at a respective resolution. Similar to before, various ones of the pages may have different resolutions in the layout, with page 2004 having a higher resolution than pages 2006, which in turn have a higher resolution than pages 2008. Also similar to before, the GUI may present one or more selected navigation options for navigating the layout of pages 2002, such as controls 2012 to move and/or increase the size of the pages in the viewable area to focus on a portion of the layout.

Again, the pages may be located and/or sized in the layout according to logical relationship(s) between the pages. In the illustrated example, the pages 2002 are from an IPC for a complex system and depict element(s) of the complex system. In various instances, the pages may be logically related according to one or more structural relationships between the elements of the complex system depicted by the pages. Again, in one example, logical relationship(s) between pages may be reflected in the drawings and/or lists themselves, such as by callouts identifying elements depicted in the drawings. As shown, for example, page 2002 includes callouts 100, 200, 300 and 600 identifying elements depicted in the drawing on the page.

Figure 21:
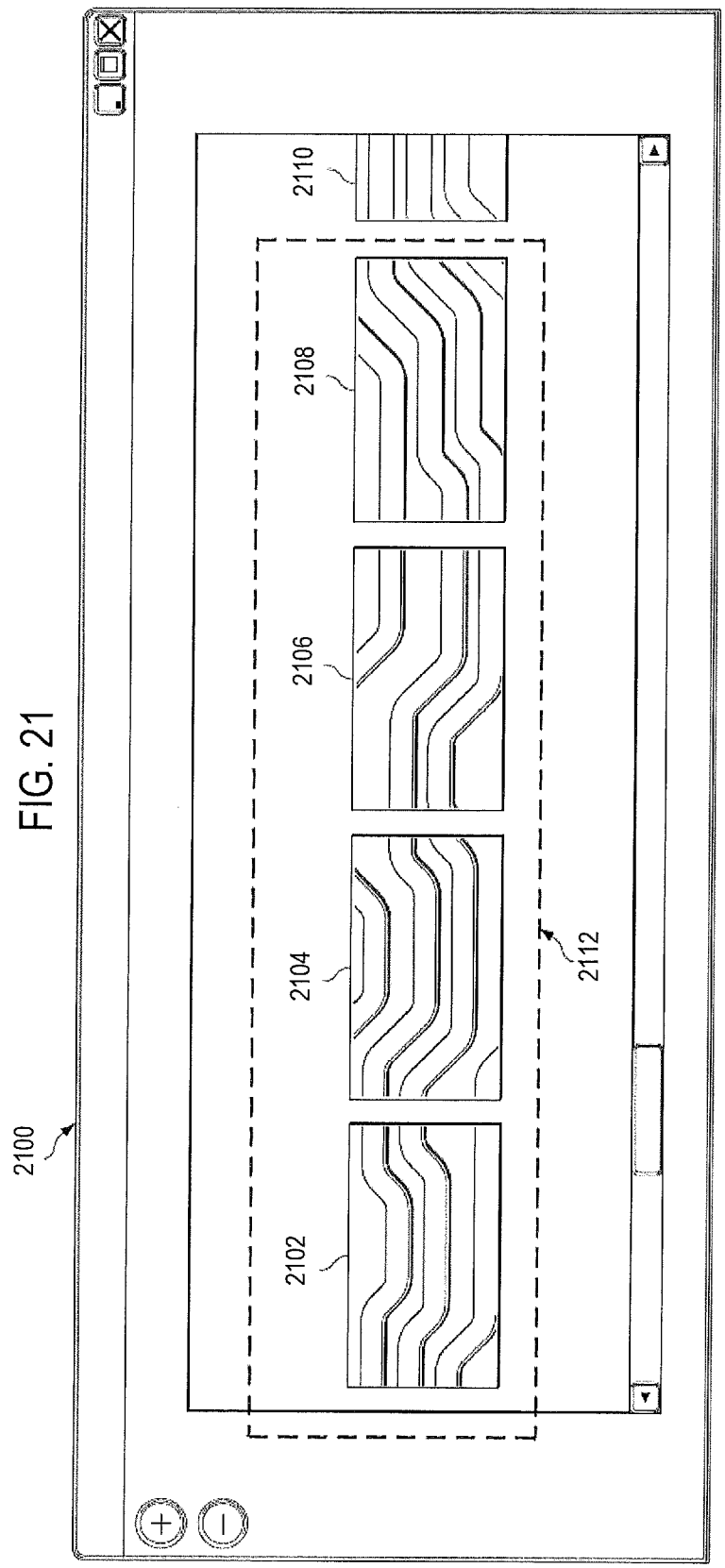

FIG. 21 illustrates an example of a layout according to the brickwall layout model 500 displayed in a GUI that has a predetermined viewable area 2100. The layout may include pages 2102-2110. In the example shown, the pages of the layout are wiring diagrams of a wiring system, which may be related by a spatial sequence. In this regard, page 2102 may depict wire(s) that connect to wire(s) depicted in page 2104. Page 2104 may in turn depict wire(s) that connect to wire(s) depicted in page 2106, and so forth for wire(s) of page 2106 to those of page 2108, and wire(s) of page 2108 to those of page 2110.

Pages of the layout entirely within the viewable area 2100 of the GUI may form or otherwise define an area or region of interest 2112. In one example, pages within the region of interest may be presented with an increased resolution relative to any pages outside the region of interest. As shown, the region of interest may include pages 2102-2108, but because only a portion of page 2110 is within the viewable area of the GUI, page 2110 may be considered outside the region of interest (although it may still be considered within the viewable area). In this instance, page 2110 may be presented at a lower resolution than the resolution(s) of pages 2102-2108.

Figure 22:
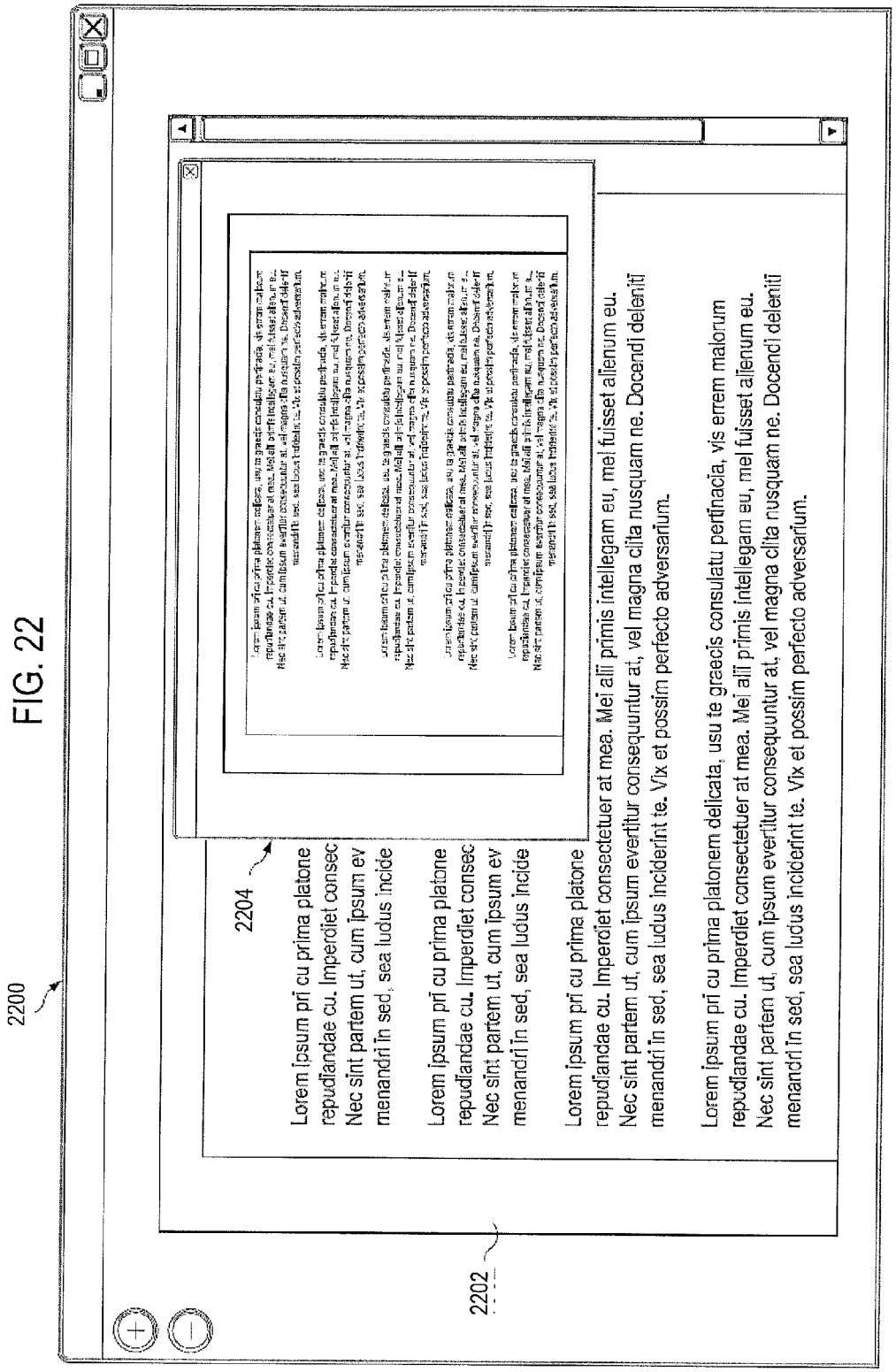

FIG. 22 illustrates an example of a layout according to the overlap-through-detail layout model 1200 displayed in a GUI that has a predetermined viewable area 2200. As shown, the layout includes pages 2202, 2204, and in which page 2202 may include a reference to page 2204. As shown, this hierarchical relationship may be maintained by the layout in which page 2204 (higher in the hierarchy) may partially overlay page 2202, and in one example, page 2204 may overlay page 2202 at the location of its reference in the respective page. As also shown, page 2204 may be presented smaller in size than page 2202, and may therefore be presented with a lower resolution than page 2202.

According to example embodiments of the present invention, the panoptic visualization system 100 and its subsystems including the document collection system 102, document layout system 104 and document navigation system 106 may be implemented by various means. Similarly, the examples of a document collection system 200, document layout system 300 and document navigation system 400, including each of their respective elements, may be implemented by various means according to example embodiments. Means for implementing the systems, subsystems and their respective elements may include hardware, alone or under direction of one or more computer program code instructions, program instructions or executable computer-readable program code instructions from a computer-readable storage medium.

In one example, one or more apparatuses may be provided that are configured to function as or otherwise implement the systems, subsystems and respective elements shown and described herein. In examples involving more than one apparatus, the respective apparatuses may be connected to or otherwise in communication with one another in a number of different manners, such as directly or indirectly via a wireline or wireless network or the like.

Generally, an apparatus of exemplary embodiments of the present invention may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor (e.g., processor unit) connected to a memory (e.g., storage device).

The processor is generally any piece of hardware that is capable of processing information such as, for example, data, computer-readable program code, instructions or the like (generally "computer programs," e.g., software, firmware, etc.), and/or other suitable electronic information. More particularly, for example, the processor may be configured to execute computer programs, which may be stored onboard the processor or otherwise stored in the memory (of the same or another apparatus). The processor may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory is generally any piece of hardware that is capable of storing information such as, for example, data, computer programs and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium which, as a non-transitory device capable of storing information, may be distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wireline) and/or wireless communications links. Examples of suitable communication interfaces include a network interface controller (NIC), wireless NIC (WNIC) or the like.

The user interfaces may include a display and/or one or more user input interfaces (e.g., input/output unit). The display may be configured to present or otherwise display information to a user, suitable examples of which include a liquid crystal display (LCD), light-emitting diode display (LED), plasma display panel (PDP) or the like. The user input interfaces may be wireline or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example embodiments, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. It will also be understood that one or more functions, and combinations of functions, may be implemented by special purpose hardware-based computer systems and/or processors which perform the specified functions, or combinations of special purpose hardware and program code instructions.

As explained above, example embodiments of the present invention permit the collection, layout and/or navigation of a large number of pages (or documents). Example embodiments may allow a user to simultaneously and quickly view and visually search a large number of pages while using less bandwidth than retrieving all of the pages. In instances in which a user may generally have an idea of the appearance of page(s) of interest, or have an idea of a logical relationship between the respective page(s) and other pages, a layout of pages may be generated and/or navigated to allow the user to locate and use page(s) of interest. The user may view and navigate pages as though they were laid out in the physical world without the physical space requirement involved with large collections of pages.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
    generating a layout of a plurality of pages of an illustrated parts catalog (IPC) for a complex system, each page of the plurality of pages being an electronic page that depicts one or more elements of the complex system,
        wherein each page of the plurality of pages also has associated metadata that provides information about the page, and that includes information identifying a link between the page and one or more other pages of the plurality of pages, the link establishing a logical relationship between the page and one or more other pages according to a structural relationship between one or more elements of the complex system depicted thereby, and
        wherein generating the layout includes panoptically arranging the plurality of pages according to the associated metadata for the plurality of pages;
    selecting one or more navigation options from a plurality of navigation options for navigating a visual presentation of the layout; and
    communicating the layout and selected navigation options.

2. The method of Claim 1, wherein the complex system is composed of one or more subsystems each of which is composed of one or more parts, and in which each part includes one or more features, the elements of the complex system including any of the complex system, one or more subsystems, one or more parts or one or more features,
    wherein for pages of the plurality of pages that depict one or more of the complex system, one or more subsystems, one or more parts or one or more features, one or more links between the pages establishes one or more logical relationships between the pages according to one or more structural relationships between the respective complex system, one or more subsystems, one or more parts or one or more features depicted thereby.

3. The method of claim 1, wherein selecting the one or more navigation options includes selecting the one or more navigation options according to the associated metadata for the plurality of pages of the layout.

4. The method of claim 1 further comprising:
receiving a request for a depiction of one or more elements of the complex system, and identifying a page of the IPC in response to the request; and
retrieving the plurality of pages for generation of the layout thereof, the plurality of pages including the page identified in response to the request and one or more other pages identified according to the associated metadata for the identified page, the associated metadata for the identified page including information identifying one or more links between the identified page and one or more other pages.

5. The method of claim 4, wherein the request is received from a user, and the associated metadata for each page of the plurality of pages also includes information about one or more content restrictions to be applied to the page, and
wherein plurality of pages are retrieved in accordance with user information and one or more content restrictions to be applied to the plurality of pages.

6. The method of claim 1, wherein the associated metadata for each page of the plurality of pages also includes information specifying one or more of a size, location or depth of the page in the layout, and
wherein for each page of the plurality of pages of the layout, the layout is generated according to the one or more of the size, location or depth specified by the information provided in the associated metadata for the page.

7. The method of claim 6, wherein a page of the plurality of pages of the layout is in a state including visual representations of the page at respective resolutions, and the associated metadata for the page provides information specifying at least the size of the page in the layout, and
wherein for the page, generating the layout includes retrieving the visual representation of the page at a resolution that matches the size specified by the information provided in the associated metadata for the page.

8. The method of claim 7, wherein the associated metadata for the page of the plurality of pages of the layout provides information specifying the size of the page relative to one or more other pages of the plurality of pages.

9. An apparatus for implementation of a system for panoptic visualization of an illustrated parts catalog (IPC), the apparatus comprising a processor and a memory storing executable instructions that in response to execution by the processor cause the apparatus to implement at least:
a layout engine configured to generate a layout of a plurality of pages of an IPC for a complex system, each page of the plurality of pages being an electronic page that depicts one or more elements of the complex system,
wherein each page of the plurality of pages also has associated metadata that provides information about the page, and that includes information identifying a link between the page and one or more other pages of the plurality of pages, the link establishing a logical relationship between the page and one or more other pages according to a structural relationship between one or more elements of the complex system depicted thereby, and
wherein the layout engine being configured to generate the layout includes being configured to panoptically arrange the plurality of pages according to the associated metadata for the plurality of pages; and
a navigation engine coupled to the layout engine and configured to select one or more navigation options from a plurality of navigation options for navigating a visual presentation of the layout,
wherein the layout and navigation engines are configured to communicate the layout and selected navigation options.

10. The apparatus of claim 9, wherein the complex system is composed of one or more subsystems each of which is composed of one or more parts, and in which each part includes one or more features, the elements of the complex system including any of the complex system, one or more subsystems, one or more parts or one or more features,
wherein for pages of the plurality of pages that depict one or more of the complex system, one or more subsystems, one or more parts or one or more features, one or more links between the pages establishes one or more logical relationships between the pages according to one or more structural relationships between the respective complex system, one or more subsystems, one or more parts or one or more features depicted thereby.

11. The apparatus of claim 9, wherein the navigation engine is configured to select the one or more navigation options according to the associated metadata for the plurality of pages of the layout.

12. The apparatus of claim 9, wherein the memory stores further executable instructions that in response to execution by the processor cause the apparatus to further implement:
a search engine coupled to the layout engine and configured to receive a request for a depiction of one or more elements of the complex system, and identify a page of the IPC in response to the request,
wherein the layout engine is configured to retrieve the plurality of pages for generation of the layout thereof, the plurality of pages including the page identified in response to the request and one or more other pages identified according to the associated metadata for the identified page, the associated metadata for the identified page including information identifying one or more links between the identified page and one or more other pages.

13. The apparatus of claim 12, wherein the search engine is configured to receive the request from a user, and the associated metadata for each page of the plurality of pages also includes information about one or more content restrictions to be applied to the page, and
wherein the layout engine is configured to retrieve the plurality of pages in accordance with user information and one or more content restrictions to be applied to the plurality of pages.

14. The apparatus of claim 9, wherein the associated metadata for each page of the plurality of pages also includes information specifying one or more of a size, location or depth of the page in the layout, and
wherein for each page of the plurality of pages of the layout, the layout engine is configured to generate the layout according to the one or more of the size, location or depth specified by the information provided in the associated metadata for the page.

15. The apparatus of claim 14, wherein a page of the plurality of pages of the layout is in a state including visual representations of the page at respective resolutions, and the associated metadata for the page provides information specifying at least the size of the page in the layout, and
wherein for the page, the layout engine being configured to generate the layout includes being configured to retrieve the visual representation of the page at a resolution of the plurality of resolutions that matches the size specified by the information provided in the associated metadata for the page.

16. The apparatus of claim 15, wherein the associated metadata for the page of the plurality of pages of the layout provides information specifying the size of the page relative to one or more other pages of the plurality of pages.

17. A computer-readable storage medium that is non-transitory and has computer-readable program code portions stored therein that, in response to execution by a processor, cause an apparatus to at least:

generate a layout of a plurality of pages of an illustrated parts catalog (IPC) for a complex system, each page of the plurality of pages being an electronic page that depicts one or more elements of the complex system, wherein each page of the plurality of pages also has associated metadata that provides information about the page, and that includes information identifying a link between the page and one or more other pages of the plurality of pages, the link establishing a logical relationship between the page and one or more other pages according to a structural relationship between one or more elements of the complex system depicted thereby, and wherein the apparatus being caused to generate the layout includes being caused to panoptically arrange the plurality of pages according to the associated metadata for the plurality of pages;

select one or more navigation options from a plurality of navigation options for navigating a visual presentation of the layout; and communicate the layout and selected navigation options.

18. The computer-readable storage medium of claim 17, wherein the complex system is composed of one or more subsystems each of which is composed of one or more parts, and in which each part includes one or more features, the elements of the complex system including any of the complex system, one or more subsystems, one or more parts or one or more features, wherein for pages of the plurality of pages that depict one or more of the complex system, one or more subsystems, one or more parts or one or more features, one or more links between the pages establishes one or more logical relationships between the pages according to one or more structural relationships between the respective complex system, one or more subsystems, one or more parts or one or more features depicted thereby.

19. The computer-readable storage medium of claim 17, wherein the apparatus is caused to select the one or more navigation options according to the associated metadata for the plurality of pages of the layout.

20. The computer-readable storage medium of claim 17, wherein the computer-readable storage medium has further computer-readable program code portions stored therein that, in response to execution by the processor, cause the apparatus to further:

receive a request for a depiction of one or more elements of the complex system, and identify a page of the IPC in response to the request; and retrieve the plurality of pages for generation of the layout thereof, the plurality of pages including the page identified in response to the request and one or more other pages identified according to the associated metadata for the identified page, the associated metadata for the identified page including information identifying one or more links between the identified page and one or more other pages.

21. The computer-readable storage medium of claim 20, wherein the apparatus is caused to receive the request from a user, and the associated metadata for each page of the plurality of pages also includes information about one or more content restrictions to be applied to the page, and wherein the apparatus is caused to retrieve the plurality of pages in accordance with user information and one or more content restrictions to be applied to the plurality of pages.

22. The computer-readable storage medium of claim 17, wherein the associated metadata for each page of the plurality of pages also includes information specifying one or more of a size, location or depth of the page in the layout, and wherein for each page of the plurality of pages of the layout, the apparatus is caused to generate the layout according to the one or more of the size, location or depth specified by the information provided in the associated metadata for the page.

23. The computer-readable storage medium of claim 22, wherein a page of the plurality of pages of the layout is in a state including visual representations of the page at respective resolutions, and the associated metadata for the page provides information specifying at least the size of the page in the layout, and wherein for the page, the apparatus being caused to generate the layout includes being caused to retrieve the visual representation of the page at a resolution of the plurality of resolutions that matches the size specified by the information provided in the associated metadata for the page.

24. The computer-readable storage medium of claim 23, wherein the associated metadata for the page of the plurality of pages of the layout provides information specifying the size of the page relative to one or more other pages of the plurality of pages.

* * * * *